United States Patent [19]
Nitobe et al.

[11] Patent Number: 6,038,311
[45] Date of Patent: Mar. 14, 2000

[54] COMMUNICATION TERMINAL APPARATUS

[75] Inventors: Kenji Nitobe; Yoshihiro Uto; Hidenori Oku, all of Tokyo, Japan

[73] Assignee: Kabushiki Kaisha Toshiba, Kawasaki, Japan

[21] Appl. No.: 08/915,383

[22] Filed: Aug. 20, 1997

[30] Foreign Application Priority Data

Aug. 21, 1996 [JP] Japan ................................ 8-220118

[51] Int. Cl.[7] .................................................. H04M 1/00
[52] U.S. Cl. ........................................ 379/428; 379/429
[58] Field of Search ................................. 379/428, 429, 379/433, 438

[56] References Cited

U.S. PATENT DOCUMENTS 4,375,584  3/1983  Muzumdar et al. .................... 379/428
4,782,522  11/1988  Kramer et al. ......................... 379/428

*Primary Examiner*—Jack Chiang
*Attorney, Agent, or Firm*—Finnegan, Henderson, Farabow, Garrett & Dunner, L.L.P.

[57] ABSTRACT

A tape carrier package is used as a controller for controlling a liquid crystal display panel, and the tape carrier package are connected to each other with use of a heat seal. The liquid crystal display panel is stack to one face of a liquid crystal display panel substrate via spacer, on the other hand, the tape carrier package is stack to the other face thereof, and then, the liquid crystal display panel substrate is attached to a main circuit board by means of a retaining member, thereby the liquid crystal display panel being attached to a display window of a telephone housing. Therefore, a structure around the liquid crystal display panel is simplified, so that the number of components can be reduced, and also an assembling work can be readily performed.

5 Claims, 16 Drawing Sheets

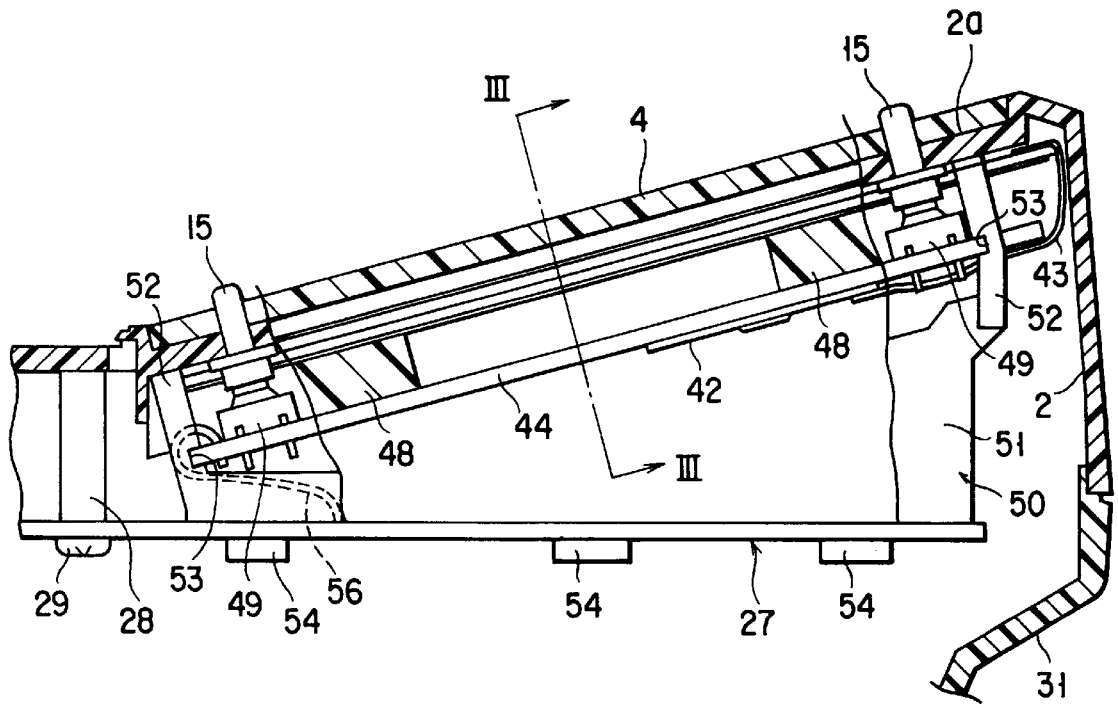
F I G. 2
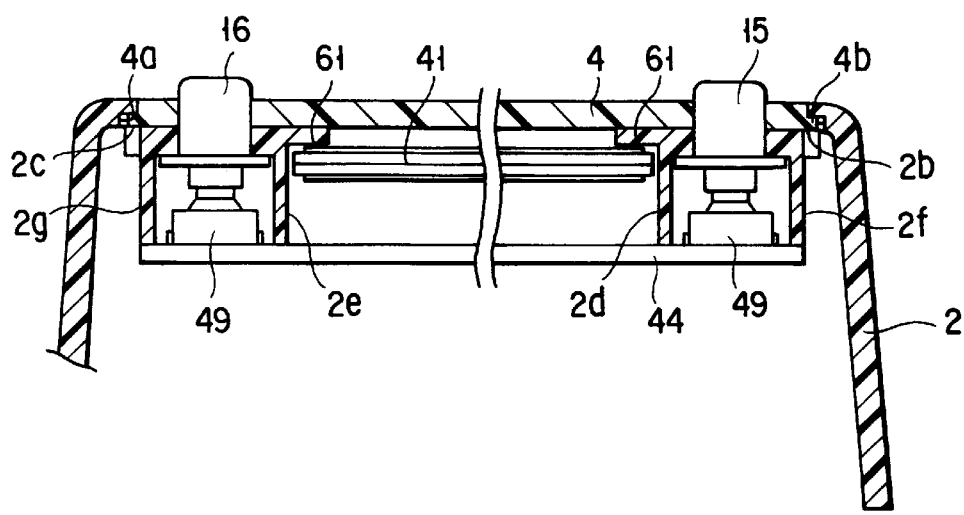
F I G. 3

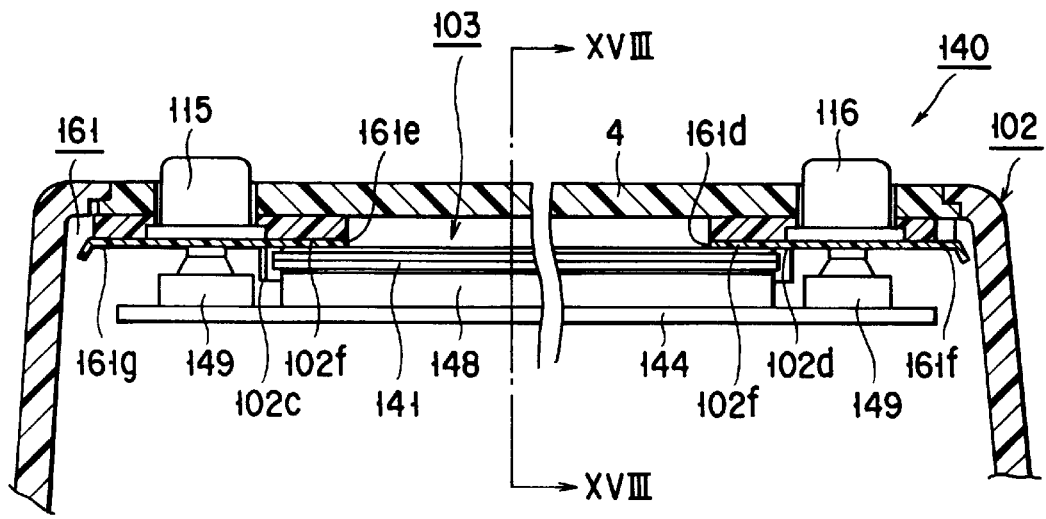
F I G. 17
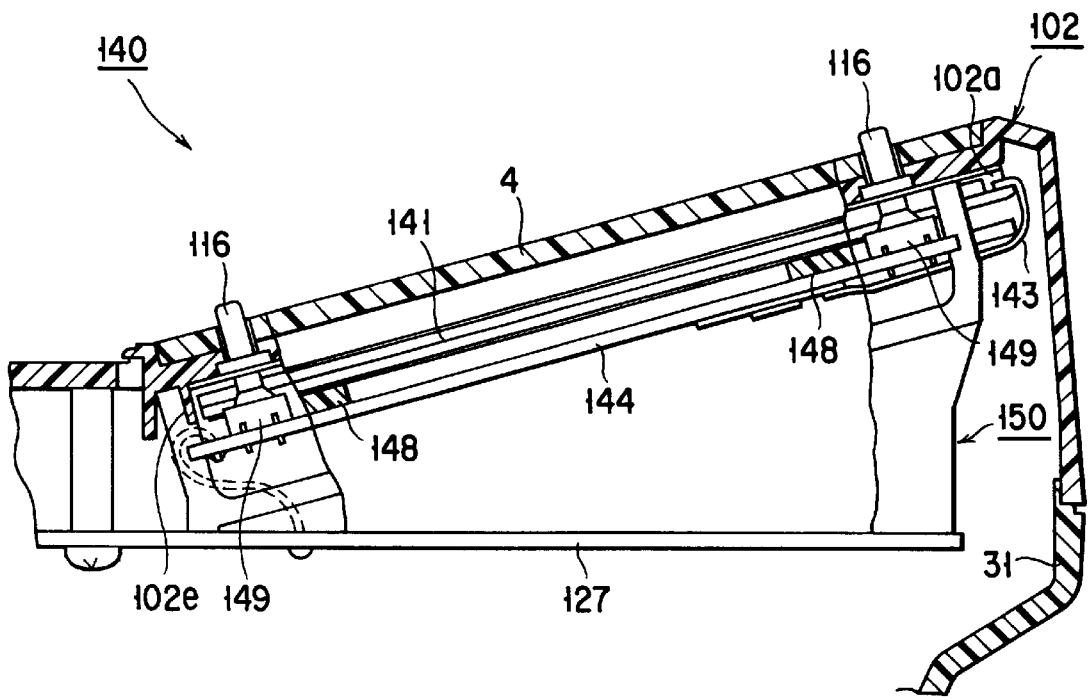
F I G. 18

COMMUNICATION TERMINAL APPARATUS

BACKGROUND OF THE INVENTION

The present invention relates to a communication terminal apparatus such as a telephone, and more particularly, to a communication terminal apparatus which has a structural improvement to enhance a quality and can realize a reduction in its manufacture cost.

Conventionally, there is a telephone having a structure in which a liquid crystal display panel capable of displaying, for example, a telephone number of call destination, is provided in a telephone housing together with an operational button such as dial button, etc.

In the telephone having the structure as described above, however, the operational button and the liquid crystal display panel is closely arranged in a telephone housing. For this reason, a structure around the liquid crystal display panel becomes complicate. This is a factor of causing various problems in a work for attaching the liquid crystal display panel to the telephone housing and in durability.

Likewise, the problem as described above is caused in, for example, data communication apparatuses for executing data communication, without being specially limited to the telephone.

BRIEF SUMMARY OF THE INVENTION

A first object of the present invention is to provide a communication terminal apparatus which can simplify a structure around a liquid crystal display unit, and can achieve simplification of an attaching work.

In order to achieve the first object, the present invention provides a communication terminal apparatus, comprising:

a communication terminal housing;

a display window provided in the communication terminal housing;

a main circuit board which is formed with a display panel attachment hole so as to be received in the communication terminal housing;

a liquid crystal display panel which is received in the communication terminal housing and has a signal terminal arranged on one side edge thereof;

a tape carrier package which has an LSI for controlling the liquid crystal display panel and is connected with a lead terminal formed on a surface of a base film;

a heat seal having a lead terminal which is formed on one side of the base film so as to connect the signal terminal of the liquid crystal display panel and one signal terminal of the tape carrier package, and which is connected with the signal terminals of the respective liquid crystal display panel and the tape carrier package by thermocompression bonding;

a liquid crystal display panel substrate having one face to which the liquid crystal display panel is stack, and having the other face to which the tape carrier package is stack, a terminal on the other face being connected with the other signal terminal of the tape carrier package by thermocompression bonding; and a retaining member which is constructed so as to locate the liquid crystal display panel in the display window of the communication terminal housing, and which has a retaining portion for holding the liquid crystal display panel substrate and a protrusion fitted into the attachment hole formed in the main circuit board.

A second object of the present invention is to provide a communication terminal apparatus which can securely prevent a damage of a circuit board accompanying with an operation of an operational button, and can perform improvement in durability. In order to achieve the second object, the present invention provides a communication terminal apparatus, comprising:

a communication terminal housing;

an operational button which is provided in the communication terminal housing so as to be freely operated;

a main circuit board which is received in the communication terminal housing;

a switch substrate which is attached to one face of the main circuit board, and has a switch operated by the operational button;

a cable connection modular jack which is attached to the communication terminal housing so as to face the switch substrate in the other face of the main circuit board, and which has an end portion abutting against the main circuit board; and external force transmission means which transmits an external force acting on the switch substrate to the modular jack, and is interposed between the switch substrate and the modular jack.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a side sectional view showing a part of attaching a liquid crystal display unit of the telephone shown in FIG. 1;

FIG. 3 is a transverse sectional view as taken along a line III—III shown in FIG. 2;

FIG. 17 is a transverse sectional view showing an attachment part of a liquid crystal display unit of the telephone according to a fifth embodiment of the present invention;

FIG. 18 is a cross sectional view as taken along a line XVIII—XVIII shown in FIG. 17;

DETAILED DESCRIPTION OF THE INVENTION

Previous to an explanation about a communication terminal apparatus of the present invention, problems of a telephone having a prior art structure that the present invention is to solve, will be described below with reference to FIG. 9, FIG. 10 and FIG. 14.

Figure 9:
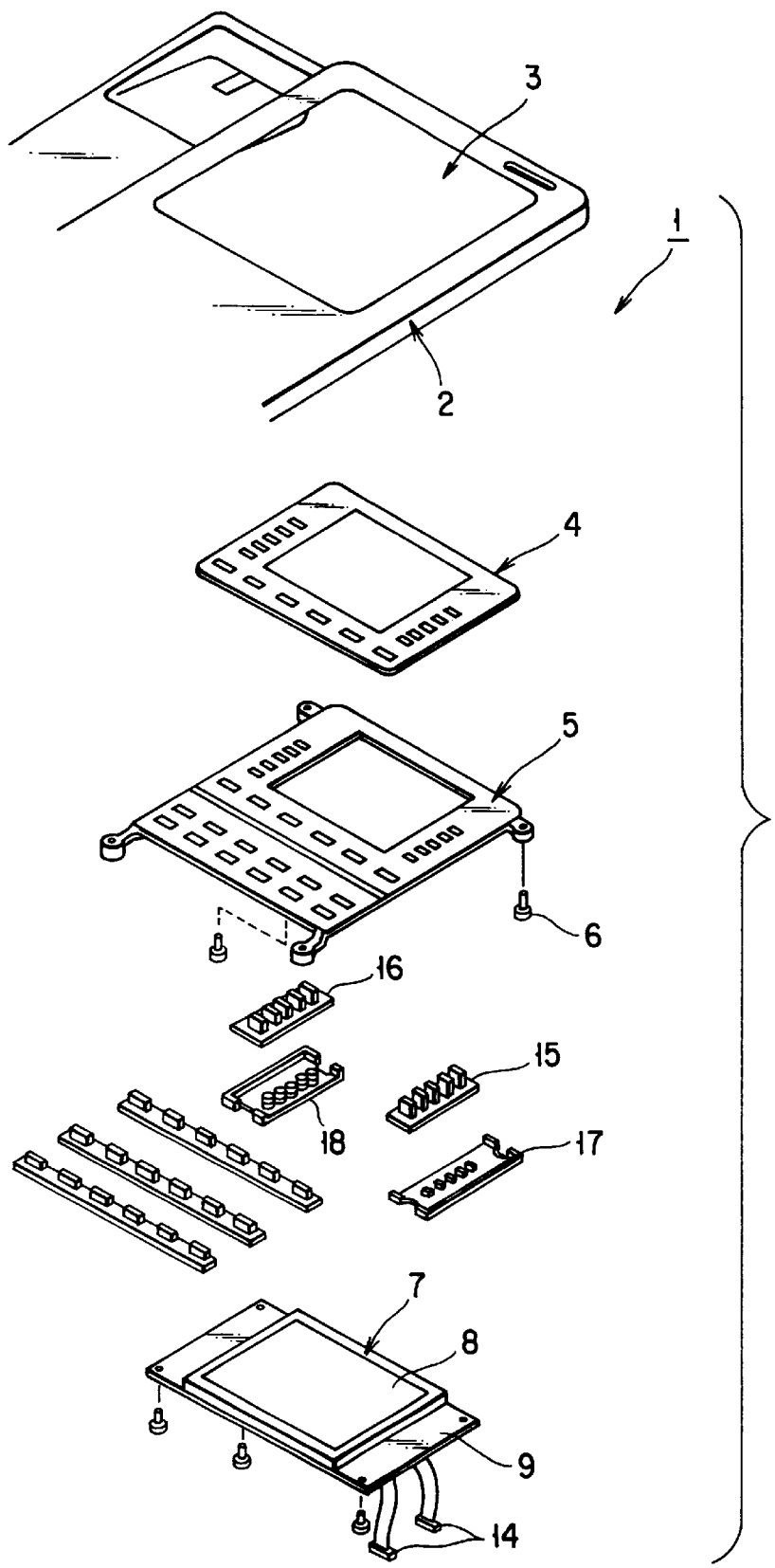
FIG. 9 is an exploded perspective view showing a liquid crystal display unit of a conventional telephone.

In a prior art telephone 1 shown in FIG. 9, an upper cover 2 forming a telephone housing is formed with a display window 3 which is fitted with a transparent cover 4. An intermediate cover 5 arranged below the transparent cover 4 is screwed inside the upper cover 2 by means of a screw 6. Also, a liquid crystal display unit 7 is arranged below the intermediate cover 5.

Figure 10:
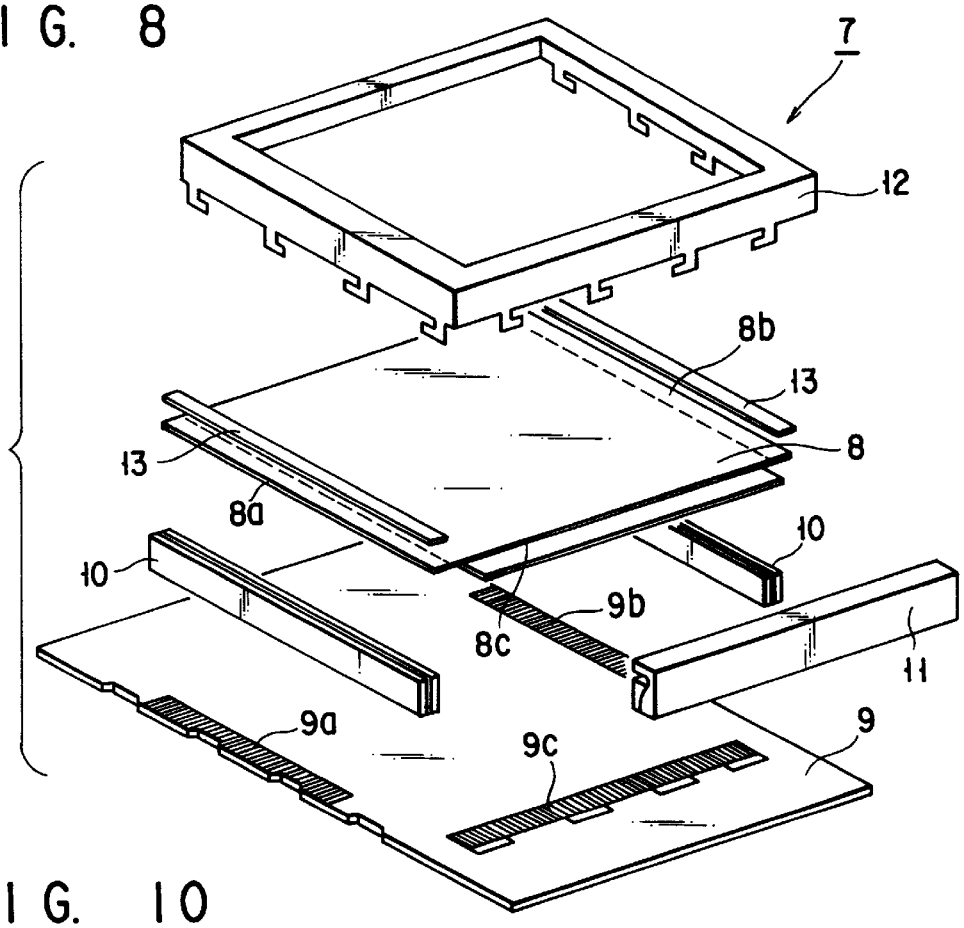
FIG. 10 is an exploded perspective view showing the liquid crystal display unit shown in FIG. 9.

As shown in FIG. 10, a liquid crystal display panel 8 of the liquid crystal display unit 7 is electrically connected to an upper side of a liquid crystal panel substrate 9 via three connectors 10 and 11 in total. Also, the liquid crystal display panel 8 is fixed onto the liquid crystal display panel substrate 9 by means of a fixing frame made of steel metal. A pair of spacers 13 made of a silicon rubber are interposed between the liquid crystal panel 8 and the fixing frame 12 so that a damage is not given to the liquid crystal display panel 8.

On the other hand, as shown in FIG. 9, substrate connectors 14 are attached onto the back side of the liquid crystal display panel substrate. These substrate connectors 14 are connected to a main circuit board (not shown) which is arranged on the identical plane together with the liquid crystal display panel substrate 9. Also, the back side of the liquid crystal display panel substrate 9 is attached with a QFP type controller for controlling an operation of the liquid crystal display panel 8 and a driver although are not illustrated.

Five-serial buttons 15 and 16 are arranged right and left sides of the liquid crystal display 7, and are fixed onto the liquid crystal display panel substrate 9 via rubber switches 17 and 18.

Figure 14:
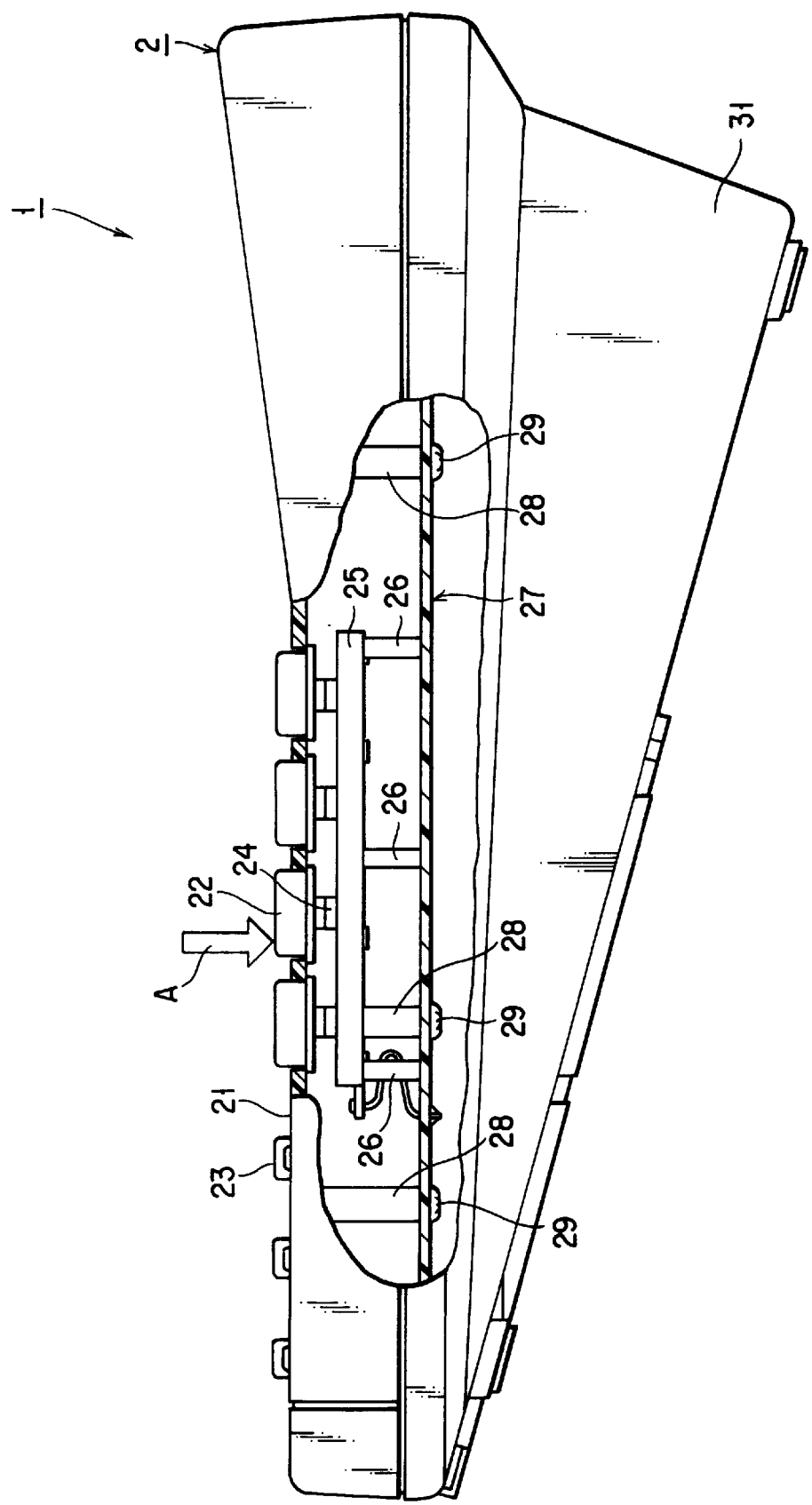
FIG. 14 is a partially cross section and broken side view showing a conventional telephone.

As shown in FIG. 14, operational buttons such as dial buttons 22 and various functional buttons 23 are arranged on an operational surface of the upper cover 2 forming a housing of the telephone 1. The inside of the upper cover 2 is provided with a switch substrate 25 which has a plurality of switches 24 operated by the dial buttons 22. The switch substrate 25 is fixed onto a main circuit board 27 by means of plural support columns 26. Also, the main circuit board 27 is attached onto end faces of plural bosses 28 projecting from the back side of the upper cover by means of a screw 29.

The telephone 1 having the aforesaid prior art structure has the following problems.

(1) Signal terminals of the liquid crystal display panel 8 are provided in a state of being divided into side edges 8a, 8b and 8c of the liquid crystal display panel 8. For this reason, three connectors 10 and 11 in total are required in order to conduct the liquid crystal display panel 8 and the liquid crystal display substrate 9. This is a factor of increasing the number of components.

(2) A metal mold needs to manufacture the fixing frame 12 made of steel metal for fixing the liquid crystal display panel 8 onto the liquid crystal display substrate 9. Thus, the cost of apparatus increases.

(3) Components for fixing the liquid crystal display substrate 9 onto the upper cover 2 is too much.

(4) The telephone 1 has a structure in which the liquid crystal display substrate 9 is fixed onto the upper cover 2, and thereafter, is electrically connected to the main circuit board 27. For this reason, expensive substrate connectors 14 must be used.

(5) The controller and driver for driving the liquid crystal display panel 8 are an expensive QFP type. Also, the distribution wiring of the QFP type controller and driver is much in number. For this reason, the liquid crystal display panel substrate 9 must be a type of an expensive double sided circuit board.

(6) Rubber switches 17 and 18 are used; for this reason, an expensive gold plating contact must be provided on the liquid crystal display panel substrate 9. Also, there is sometime a case where a shift occurs in position between these rubber switches 17 and 18 and the gold plating contact in assembling.

(7) Three silicon connectors 10 and 11 in total are used to electrically connect the liquid crystal display panel 8 with the liquid crystal display panel substrate 9.

For this reason, the following problems is caused: (i) Terminal parts 9a, 9b and 9c, which are subjected to gold plating treatment, must be provided on the surface of the liquid crystal display panel substrate 9, causing a problem of increasing manufacture cost. (ii) The liquid crystal display panel 8 with the liquid crystal display panel substrate 9 must be aligned in position with high precision; therefore, assembling is difficult. (iii) When receiving vibration and impact, the liquid crystal display panel substrate 9 and connectors 10 and 11 are shifted in position; for this reason, there is a case where the operation of the liquid crystal display panel 8 is not performed.

The aforesaid telephone 1 having the prior art structure has the following problems.

More specifically, as shown by an arrow A in FIG. 14, an external force A acting on the dial button 22 affects the main circuit board 27 through the switch 24, the switch substrate 25 and the support column 26. When weighty things such as a thick book are dropped on the telephone 1 in error, a great external force A is applied to the dial button 22. At this moment, a great shearing stress acts on the circumstance of the screw 29 used for attaching the main circuit board 27 onto the boss 28, and if worst comes to worst, a crack occurs in the main circuit board 27. Such a problem is liable to occur in the case where a paper phenol base material is used as a base material of the main circuit board 27. Because the paper phenol base material has a lower strength as compared with a glass base material although is a low price.

A communication terminal apparatus according to embodiments of the present invention will be described below in detail with reference to the accompanying drawings. In this case, like reference numerals are used to designate the same parts as the aforesaid telephone having the prior art structure.

First Embodiment

Referring now to FIG. 1 to FIG. 8, a telephone according to a first embodiment of the present invention will be described below.

Figure 1:
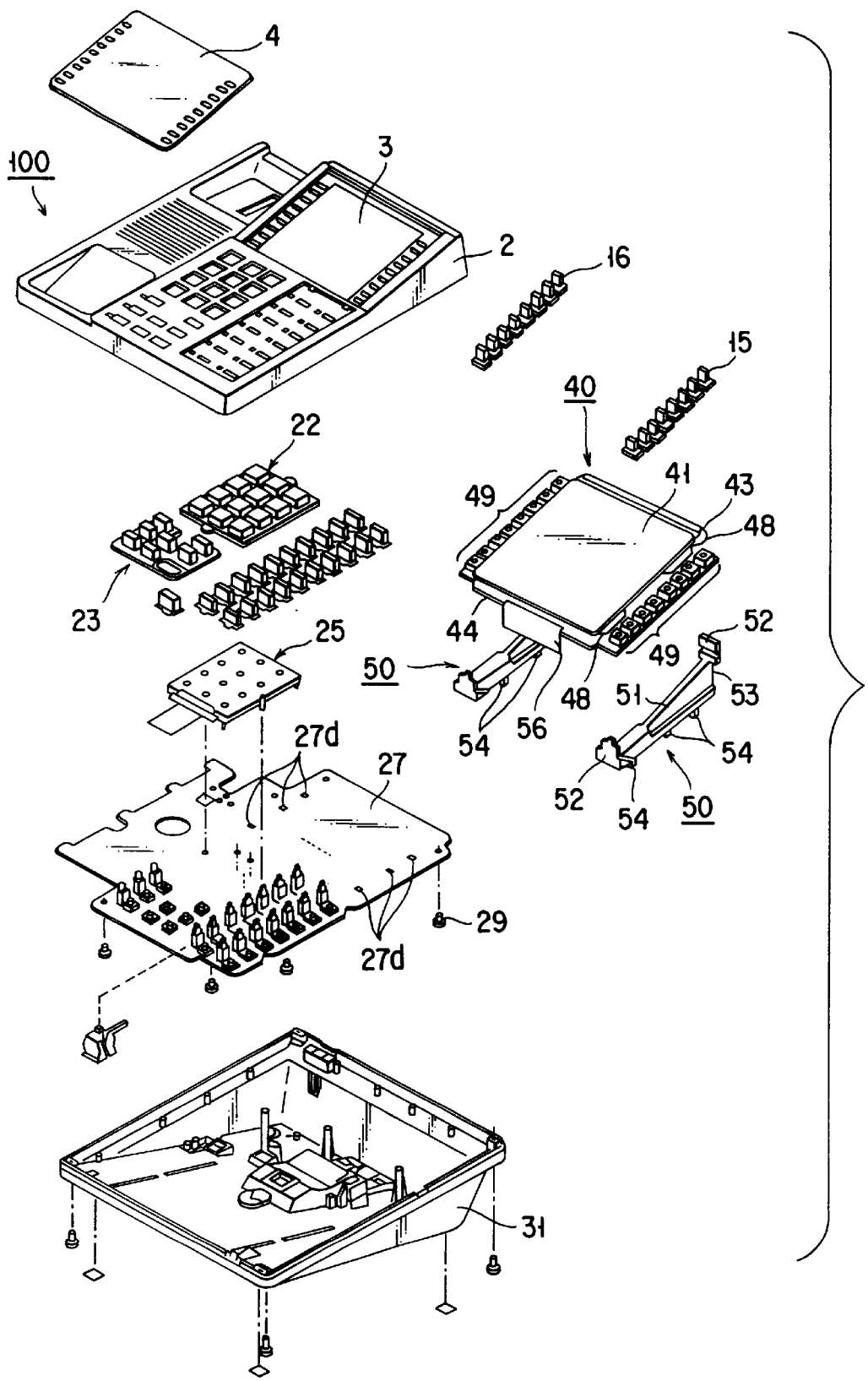
FIG. 1 is an exploded perspective view showing a telephone according to a first embodiment of the present invention.

As shown in FIG. 1, in a telephone 100 according to the first embodiment of the present invention, an upper cover 2 forming a telephone housing is provided with a display window 3 which is attached with a transparent cover 4. As shown in FIG. 2, the transparent cover 4 is fitted into a stepped recess portion 2a formed at the circumstance of the display window 3 from the outside of the upper cover 2. This serves to prevent an external force applied to the display window 3 from directly acting on a liquid crystal display unit 40 which is located below the transparent cover 2, so that the liquid crystal display unit 40 can be protected. Also, as shown in FIG. 3, the transparent cover 4 is fixed onto the upper cover 2 because its pawl portions 4a and 4b engage with pawl receiving portions 2a and 2b.

Figure 4:
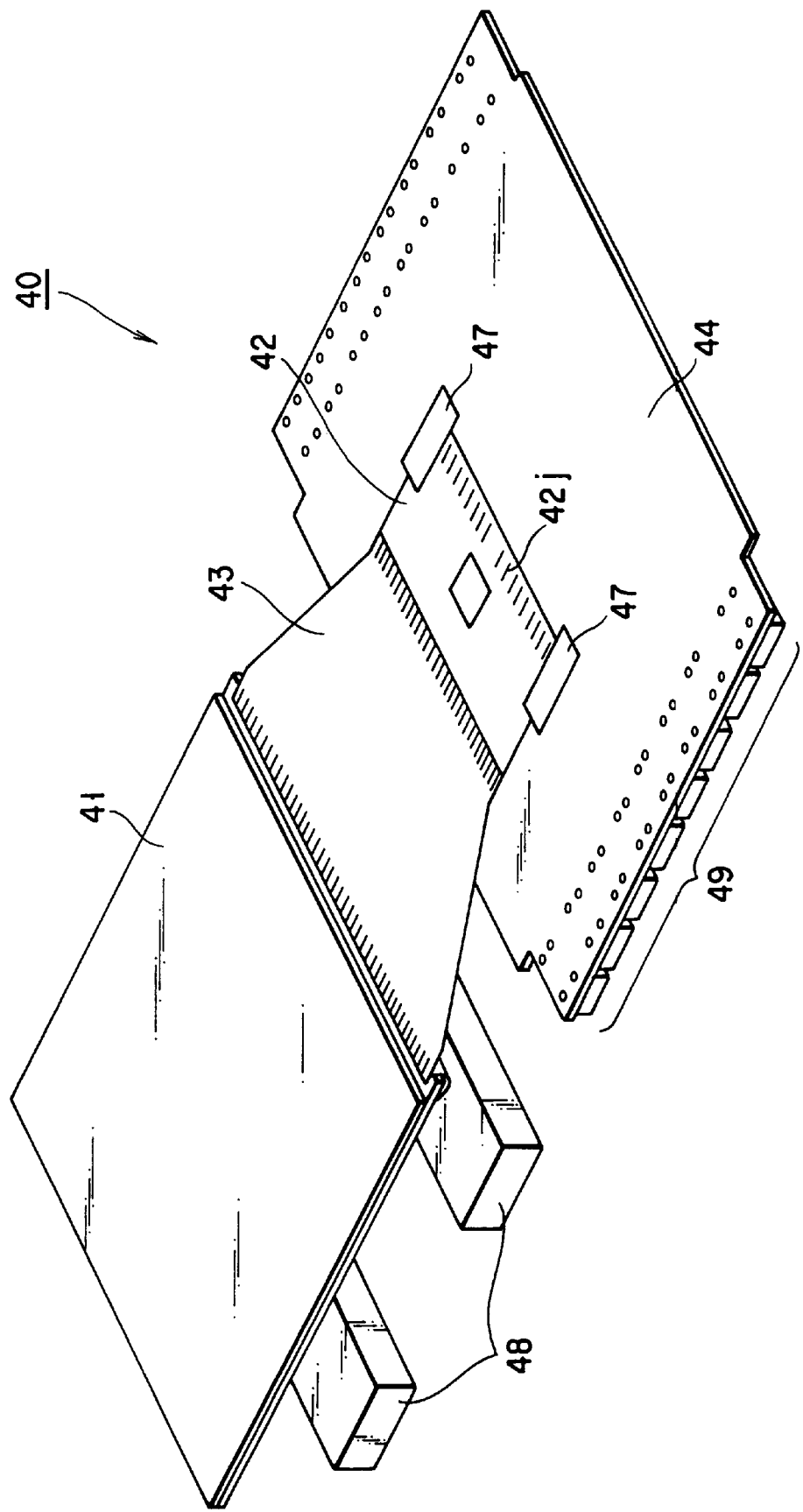
FIG. 4 is a developed perspective view of the liquid crystal display unit shown in FIG. 2 and FIG. 3.

As shown in FIG. 4, the liquid crystal display unit 40 comprises a liquid crystal display panel 41, a tape carrier package 42 having an LSI for controlling the liquid crystal display panel 41, a heat seal (connector) 43 for making a connection between the tape carrier package 42 and the liquid crystal display panel 41, and a liquid crystal display panel substrate 44 on which the liquid crystal display panel 41 and the tape carrier package 42 are mounted.

Figure 6A:
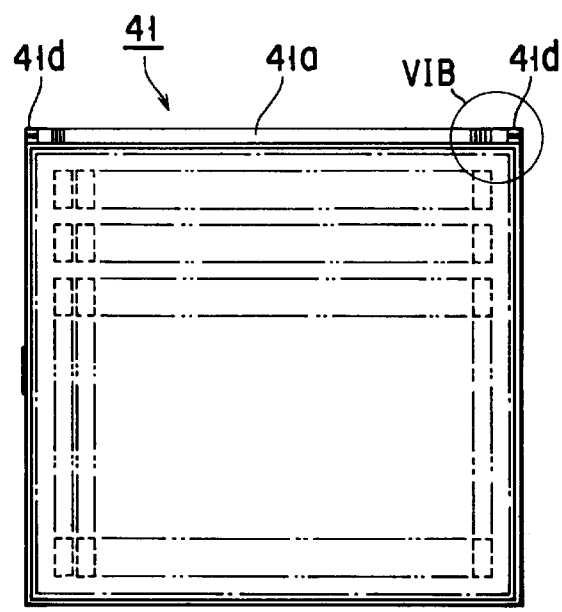
FIG. 6A is an enlarged plan view showing the liquid crystal display panel of the unit.
Figure 6B:
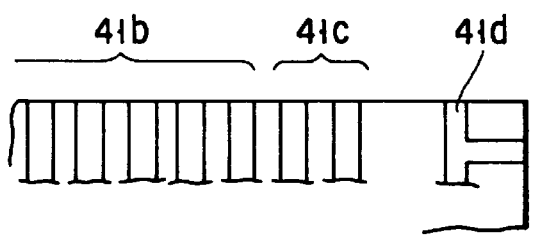
FIG. 6B is an enlarged plan view showing some parts of the display panel.

The liquid crystal display panel 41 has a character display ability of 20-letter X 8-line. Also, as shown in FIGS. 6A and 6B, one side edge 41a of the liquid crystal display panel 8 is provided with 164 signal terminals 41b in total and four dummy terminals 41c in total which are arranged two by two on right and left sides of these signal terminals 41b. These signal terminals 41b and dummy terminals 41c are arranged so as to come into line. The opposite ends of the side edge 41a are each provided with a T-letter mark which is used for positional alignment in making a connection with the heat seal 43.

Figure 7:
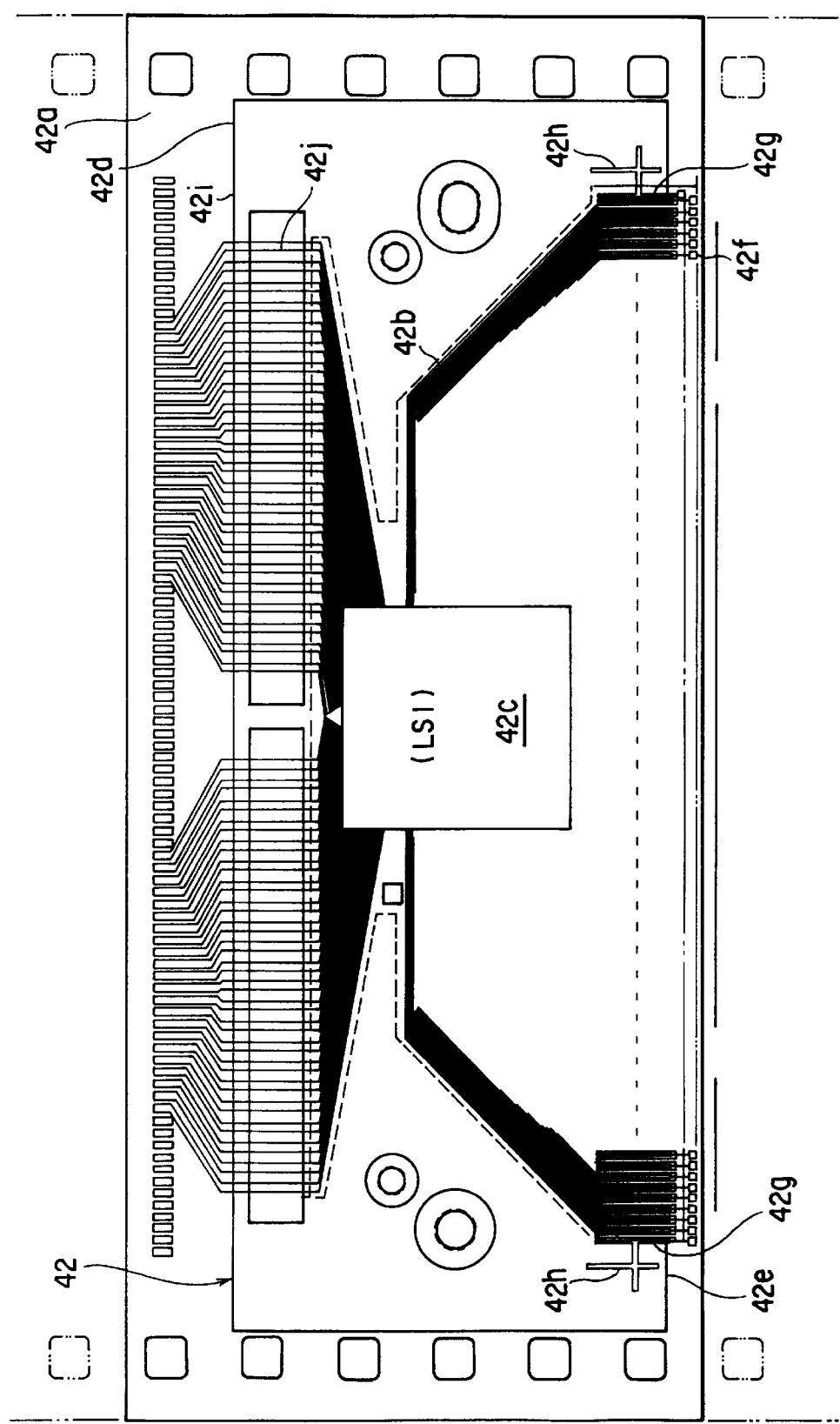
FIG. 7 is a plan view of a tape carrier package.

As shown in FIG. 7, the tape carrier package 42 is formed with lead terminals 42b on the surface of a flexible base film 42a thereof. These lead terminals 42b are connected to an LSI (Large Scale Integrated Circuit) 42c which controls an operation of the liquid crystal display panel 41. The tape carrier package 42 is supplied in a state of being wound around a drum, and is completed by cutting the base film 42a along a cut-off line 42d shown in FIG. 7.

As shown in FIG. 7, the tape carrier package 42 has 164 signal terminals 42f in total and four dummy terminals 42g in total arranged two by two on right and left side of these signal terminals at its one side edge 42e. Also, opposite ends of the side edge 42e are provided with a pair of cross marks 42h which are used for positional alignment in making a connection with the heat seal 43. The other side edge 42I of the tape carrier package 42 is provided with 164 signal terminals 42j in total which are connected with signal terminals provided on the liquid crystal display panel substrate 44.

Figure 8:
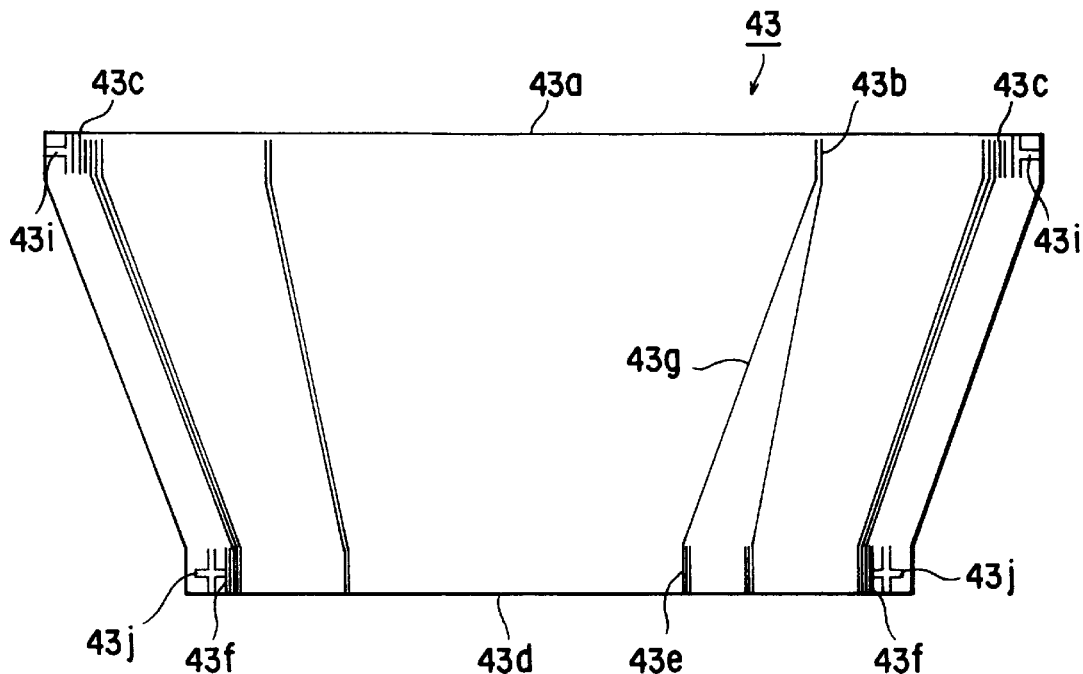
FIG. 8 is a plan view of a heat seal.

The heat seal 43 is a film-like member having a substantially trapezoidal shape as shown in FIG. 8. One side edge 43a of the heat seal 43 is provided with 164 signal terminals 43b in total and four dummy terminals 43c in total which are connected to signal terminals and dummy terminals of the liquid crystal display panel 41. These signal terminals 43b and dummy terminals 43c are arranged so as to come into line. The other side edge 43d of the heat seal 43 is provided with 164 signal terminals 43e in total and four dummy terminals 43f in total which are connected to signal terminals and dummy terminals of the tape carrier package 42. These signal terminals 43e and dummy terminals 43f are arranged so as to come into line.

The signal terminals 43b and 43e are connected to each other by means of 168 lead terminals 43g in total which are formed on the surface of the base film by a pattern printing. Also, these lead terminals 43g, signal terminals 43b and 43e and dummy terminals 43c and 43f are coated with an insulating film which is melted by heat. Both ends of side edges 43a are provided with a pair of T-letter marks 43i which is used for positional alignment; on the other hand, both ends of side edges 43a are provided with a pair of cross marks 43j which is used for positional alignment.

Next, the following is an explanation about procedures for electrically connecting the liquid crystal display panel 41 with the tape carrier package 42 with use of the heat seal 43.

In order to electrically connecting the liquid crystal display panel 41 with the heat seal 43, first, their signal terminals 41b and 43b overlap each other; on the other hand, their dummy terminals 41c and 43c overlap each other. At this time, positional alignment T-letter marks 41d and 43i provided individually on the liquid crystal display panel 41 and the heat seal 43 overlap so as to perfectly coincide with each other with use of a microscope. By doing this, signal terminals of the liquid crystal display panel and the heat seal and dummy terminals of the same, which are arranged at interval of 0.25 millimeter, can be securely overlapped each other.

When the liquid crystal display panel 41 and the heat seal 43 are heated while being pressed in a state that their signal terminals and dummy terminals individually overlap each other, the insulating film of the heat seal 43 is melted, and then, their signal terminals and their dummy terminals respectively contact directly with each other. Thereafter, signal terminals and dummy terminals respectively are connected to each other by thermocompression bonding.

The tape carrier package 42 and the heat seal 43 are connected in the same manner as the aforesaid procedures. Whereby the liquid crystal display panel 41 and the tape carrier package 42 are connected by means of the heat seal 43, as shown in FIG. 4.

In the first embodiment, dummy terminals 41c and 43c provided adjacent to signal terminals 41b and 43b are connected to each other by thermocompression bonding. This serves to prevent bonded portions of signal terminals 41b and 43b from peeling therefrom.

As seen from the above explanation, in the telephone 100 of the first embodiment, the tape carrier package 42 is used as the controller for controlling the liquid crystal display panel 41, and the liquid crystal display panel 41 and the tape carrier package 42 are connected to each other by means of the heat seal. Therefore, the number of components can be reduced, and simplification in structure can be achieved.

Further, since the tape carrier package 42 is used as the driver controller for driving the liquid crystal display panel 41, this serves to reduce the number of components for electrically connecting the tape carrier package 42 with the liquid crystal display panel substrate 44. Also, the liquid crystal display panel substrate 44 may be a single-sided substrate.

Furthermore, since the liquid crystal display panel 41, the heat seal 43, the tape carrier package 42 and the liquid crystal display panel substrate 44 are electrically connected to each other by thermocompression bonding, no failure is caused in an operation of the liquid crystal display unit even though vibration and impact act on the telephone. Therefore, reliability in the telephone can be improved.

Positional alignment cross marks and T-letter marks are used in case of connecting the liquid crystal display panel 41, the heat seal 43 and the tape carrier package 42 by thermocompression bonding, so that signal terminals provided these components can be readily and accurately connected to each other.

Substantially, the following is an explanation about procedures for attaching the liquid crystal display panel 41 and the tape carrier package 42, which are connected as described above, to the liquid crystal display panel substrate 44.

As shown in FIG. 4, first, the tape carrier package 42 is put on the surface of the liquid crystal display panel substrate 44 with use of a double-faced tape 46 in a state in which positional alignment is made so that the signal terminals 42j of the tape carrier package 42 and signal terminals on the surface of liquid crystal display panel substrate 44 overlap each other. Next, when the signal terminals 42j of the tape carrier package 42 and signal terminals on the surface of liquid crystal display panel substrate 44 are heated while being pressed, an auxiliary solder stack to the signal terminals of the liquid crystal display panel substrate 44 is melted, and then, the former and the latter are bonded together. Subsequently, as shown in FIG. 4, insulating tapes 47 are put on the surface of liquid crystal display panel substrate 44 so that the tape carrier package 42 can be prevented from peeling from the surface of liquid crystal display panel substrate 44.

Figure 5:
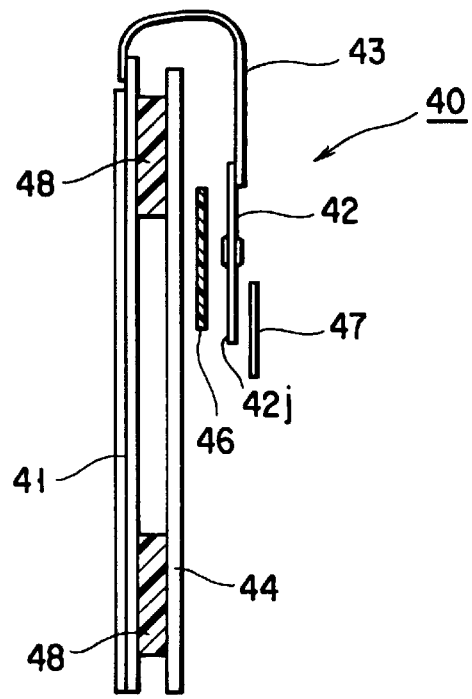
FIG. 5 is a side view showing an attachment to a liquid crystal display panel substrate of the liquid crystal display unit.

Then, the heat seal 43 is bent as shown in FIG. 5, and the liquid crystal display panel 41 faces the back side of the liquid crystal display panel substrate 44. Thereafter, the liquid crystal display panel 41 is stack onto the back side of the liquid crystal display panel substrate 44 with use of a pair of adhesive spacers 48. Thus, the attachment of the liquid crystal display panel 41 to the liquid crystal display panel substrate 44 is completed.

As seen from the above explanation, in the telephone 100 of the first embodiment, it is possible to very readily attach the liquid crystal display panel 41 and the tape carrier package 42 onto the liquid crystal display panel substrate 44.

According to the first embodiment, there is no need of using the steel metal fixing frame employed in the prior art in order to fix the liquid crystal display panel 41 onto the liquid crystal display panel substrate 44. Therefore, the mold for manufacturing the aforesaid fixing frame is unnecessary, so that the cost of apparatus can be reduced.

The following explanation is about procedures for fixing the liquid crystal display unit 40 constructed as described above to the main circuit board 27.

As shown in FIG. 1, in the telephone 100 of the first embodiment, the liquid crystal display unit 40 is fixed onto the main circuit board 27 with use of a pair of retaining members 50.

The retaining member 50 is manufactured by subjecting plastic materials to injection molding. As shown in FIG. 1 and FIG. 2, the retaining member 50 comprises a substantially triangular-like plate main body 51. The main body 51 is provided with rectangular retaining portions 52, which face each other, at its front and rear ends. The paired retaining portions 52 are respectively formed with a recess 53 which engages with an end portion of the liquid crystal display panel substrate 44. The retaining portion 52 of the retaining member 50 holds the liquid crystal display panel substrate 44 in a state of engaging the recess 53 with the end portion of the liquid crystal display panel substrate 44.

The lower face of the main body 51 is formed with three protrusions 54 projecting therefrom. These three protrusions 54 are fitted into three holes 27d which are formed on the main circuit board 27 so as to come into line.

The liquid crystal display unit 40 is fixed onto the main circuit board 27 by fitting the protrusions 54 of the retaining member 50 into the holes of the main circuit board 27 in a state in which the end portion of liquid crystal display panel substrate 44 is held in each recess 53 formed in the paired retaining members 50. And then, a leading end of a flat cable 56 is soldered to the liquid crystal display panel substrate 44, and thus, the liquid crystal display panel substrate 44 and the main circuit board 27 are electrically connected to each other.

As mentioned above, in the telephone 100 of the first embodiment, the liquid crystal display panel substrate 44 and the main circuit board 27 are previously constructed so as to be readily assembled. Therefore, it is possible to use the flat cable 56 in order to electrically connect the liquid crystal display panel substrate 44 and the main circuit board 27 to each other. Thus, there is no need of using any expensive substrate connectors, so that reduction in its manufacture cost can be achieved.

In the telephone 100 of the first embodiment, the liquid crystal display panel substrate 44 is previously attached to the main circuit board 27. Therefore, as shown in FIG. 2, the liquid crystal display unit 40 is situated below the transparent cover 4 by attaching the main circuit board 27 to the boss 28 of the upper cover 2 with use of the screw 29.

In this case, as shown in FIG. 3, an elastic sheet 61 made of a soft synthetic resin material is stack onto the back face of the upper cover 2. This serves to avoid the following disadvantages. Specifically, it is possible not only to prevent the liquid crystal display panel 41 from being damaged when abutting against the upper cover, but also to prevent an entrance of dust from a clearance between the liquid crystal display panel 41 and the upper cover 2.

As shown in FIG. 3, the liquid crystal display panel 41 is positioned by means of a pair of ribs 2d and 2e which vertically extend from the backside of the upper cover. This serves to prevent the liquid crystal display unit 40 from being shifted in right and left direction of the telephone 100. Further, the liquid crystal display panel 41 is previously provided with a convex portion which abuts against the backside of the upper cover 2, at its front and rear end portions, and by doing this, it is possible to prevent the liquid crystal display unit 40 from being shifted in a vertical direction of the telephone 100.

As described before, the liquid crystal display panel 41 is put on the liquid crystal display panel substrate 44 via the elastic spacers 48, and further, the elastic sheet 61 is interposed between the upper cover 2 and the liquid crystal display panel 41. Whereby no breakage is caused in the liquid crystal display panel 41 even if a great impact acts on the liquid crystal display panel 41 when dropping the telephone 100 in error.

Also, the liquid crystal display panel substrate 44 is a single-sided substrate having g a circuit on the tape carrier package 42 side. Thus, as shown in FIG. 1, a tact switch on the market can be used as a switch 49 operated by the operational buttons 15 and 16. Therefore, there is no need of using the expensive rubber switches 17 and 18 as used in the prior art telephone 1 shown in FIG. 9, and of providing gold plating contacts as portions contacting with these rubber switches in the liquid crystal display panel substrate 44, so that manufacture cost can be reduced.

Second Embodiment

Next, a telephone according to a second embodiment of the present invention will be described below with reference to FIG. 11.

Figure 11:
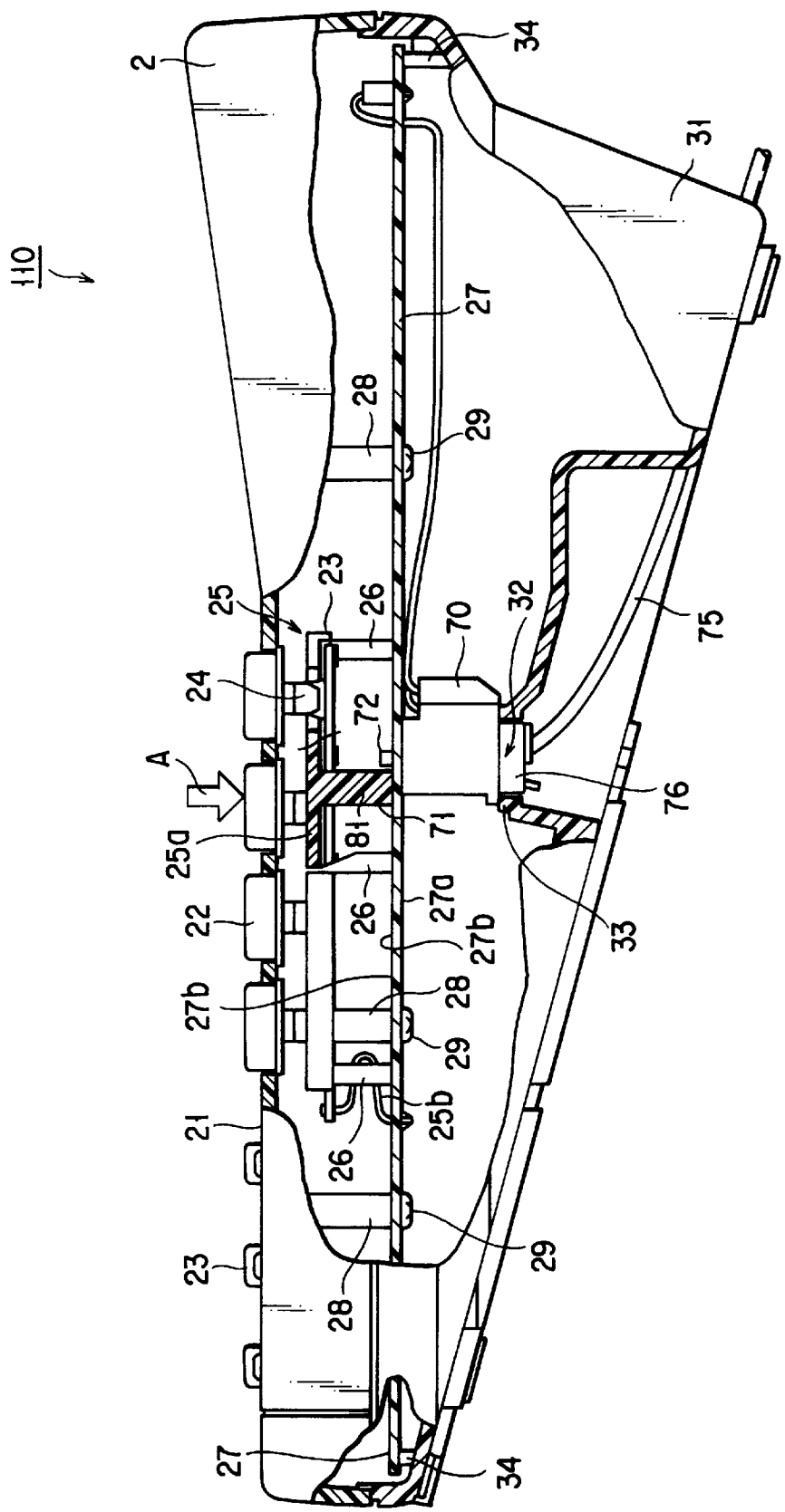
FIG. 11 is a partially cross section and broken side view of a telephone according to a second embodiment of the present invention.

As shown in FIG. 11, in a telephone 110 of the second embodiment, an operational surface 21 of the upper cover 2 is provided with operational buttons such as dial buttons 22 and various functional buttons 23, etc. Also, an inner side of the upper cover 2 is provided with a keypad switch assembly 25 which has switches 24 operated by the dial buttons 22 and functions as a switch substrate. This keypad switch assembly 25 has a keypad frame 25a caulking a silicon contact rubber and a keypad substrate having a surface contact portion which is subjected to carbon printing, and a cable 25b which connects the keypad substrate with the main circuit board 27. Further, the keypad switch 25 is fixed onto the main circuit board 27 via a support column 26.

The main circuit board 27 is attached onto end portions of plural bosses 28 projecting from the back side of the upper cover 2 with use of a screw 29. Further, an outer peripheral portion of the main circuit board 27 is supported by means of support pins 34 projecting toward the upper cover 2 from a lower cover 31 forming a telephone housing together with the upper cover 2.

The aforesaid lower cover 31 is formed with a hole 32 for attaching a modular jack at a position corresponding to the keypad switch assembly 25. The hole 32 is attached with a modular jack 70 which is a female terminal for a cable connection. The modular jack 70 is fitted with a male terminal 76 to which a cable 75 is connected. An end portion 71 of this modular jack 70 is arranged so as to abut against a surface 27a of the main circuit board 27. A protrusion 72 formed on the end portion 71 penetrates through the main circuit board 27 so that the modular jack 70 is not shifted in position with respect to the main circuit board 27. The modular jack 70 is supported by means of a rib 33 which forms a circumferential edge of the hole 32 so that its end portion 71 is not separated from the surface 27a of the main circuit board 27.

Namely, the main circuit board 27 is supported by means of the modular jack 70 so as not to deflect toward the lower cover 31 side.

As seen from FIG. 11, the keypad frame 25a of the keypad switch assembly 25 is formed with a boss 81 which has a distal end abutting against a surface 27b of the main circuit board 27, at a position corresponding to the modular jack 70.

More specifically, an external force transmission means, which is composed of the boss 81 and the main circuit board 27, is interposed between the keypad switch assembly 25 and the modular jack 70. Most of the external force acting on the dial button 22 is transmitted to the modular jack 70 through the keypad frame 25a of the keypad switch assembly 25, the boss 81 and the main circuit board 27.

The following is an explanation about an operation of the telephone 110 according to the second embodiment.

An external force A shown by an arrow in FIG. 11, first, acts on the dial button 22, and then, is transmitted to the lower cover 31 successively via the keypad frame 25a of the keypad switch assembly 25, the boss 81 and the support column 25, the main circuit board 27 and the modular jack 70.

At this time, since the main circuit board 27 is supported by means of the modular jack 70, the main circuit board 27 is not broken even if it warps due to the external force. Also, since the modular jack 70 is located on a position corresponding to the keypad switch assembly 25, most of the external force A is received by means of the modular jack. Thus, a great shearing stress resulting from the external force A is not applied to the circumference of the screw 29 used for attaching the main circuit board 27 to the boss 28, so that damage can be prevented from being given to the main circuit board 27.

Since the aforesaid external force transmission means is interposed between the keypad switch assembly 25 and the modular jack 70, most of the external force A acting on the keypad switch assembly 25 is transmitted directly to the modular jack 70. Thus, a great shearing stress resulting from the external force A is not applied to the circumference of the screw 29 used for attaching the main circuit board 27 to the boss 28, so that a damage can be prevented from being given to the main circuit board 27.

In this case, since the keypad switch assembly 25 is used as a switch for the dial buttons 22 in the telephone 110 of the second embodiment, the external force A is received by the keypad frame 25a, and thereafter, is transmitted to the modular jack 70 via the boss 81 even if applied to any one of 12 dial buttons 22. Therefore, a damage can be prevented from being given to the main circuit board 27 even if the external force A is applied to any one of dial buttons 22.

Also, this second embodiment shows a structure in which the main circuit board 27 is held between the keypad switch assembly 25 and the modular jack 70. A through hole for inserting the boss 81 therethrough may be formed in the main circuit board 27 so that the boss 81 can be directly abutted against the modular jack 70.

Third Embodiment

Figure 12:
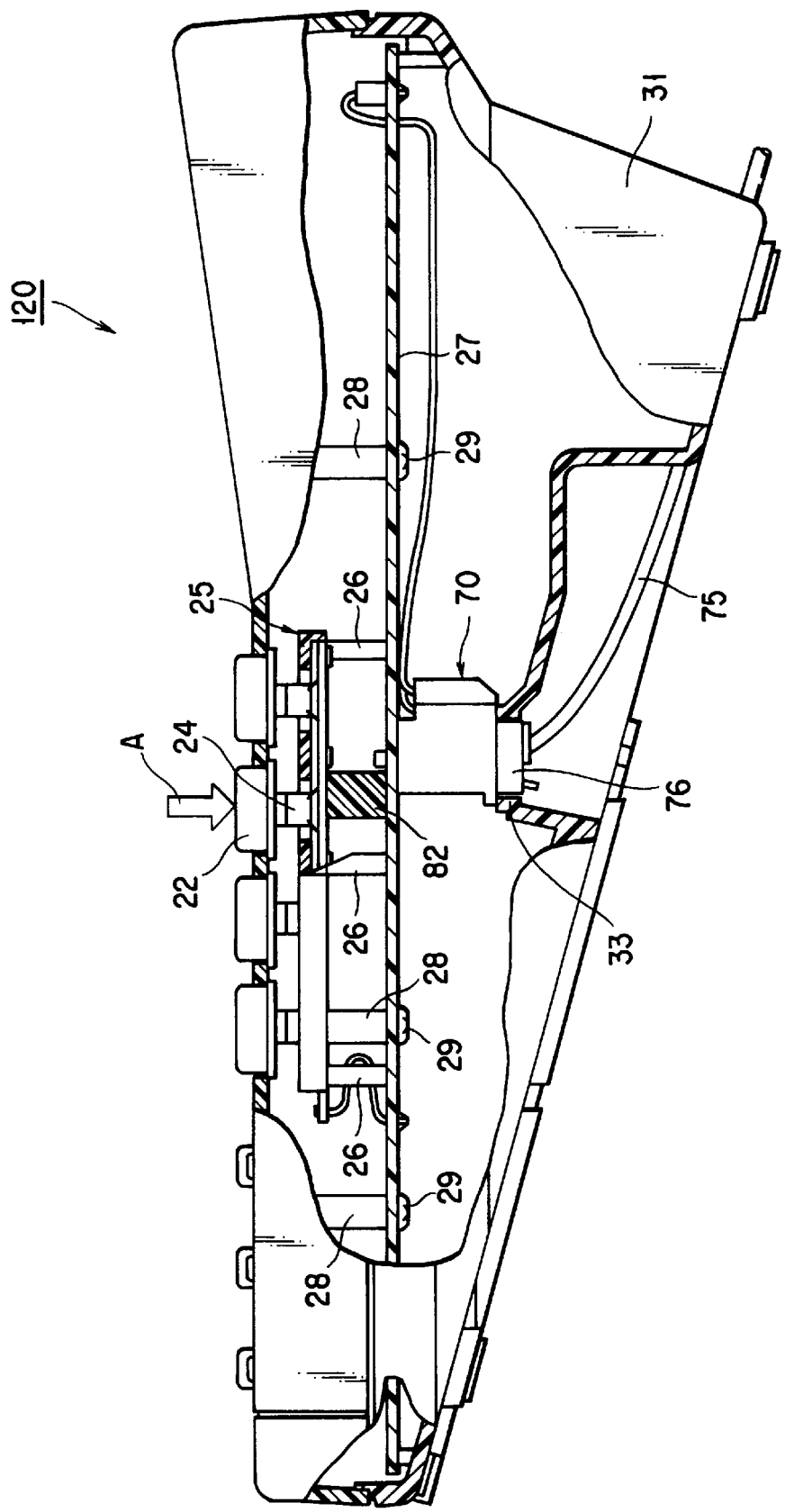
FIG. 12 is a partially cross section and broken side view of a telephone according to a third embodiment of the present invention.

As shown in FIG. 12, in a telephone 120 according to a third embodiment, a spacer 82 is interposed between the keypad switch assembly 25 and the main circuit board 27. A double-faced adhesive tape is stack to opposite end faces of the spacer 82 so that a shift is not caused in position between the keypad switch assembly 25 and the main circuit board 27.

With the above construction, the external force A acting on the keypad switch assembly 25 via the operational button 22 is received by the lower cover 31 via the aforesaid spacer 82, the main circuit board 27 and the modular jack 70. Therefore, a damage can be prevented from being given to the main circuit board 27 like the telephone 110 according to the second embodiment.

Namely, in the telephone 120 according to the third embodiment, the spacer 82 is independently interposed between the keypad switch assembly 25 and the main circuit board 27. Therefore, there is no need of modifying a shape of the keypad switch assembly 25, and the keypad switch assembly can be provided at a low cost.

Fourth Embodiment

Figure 13:
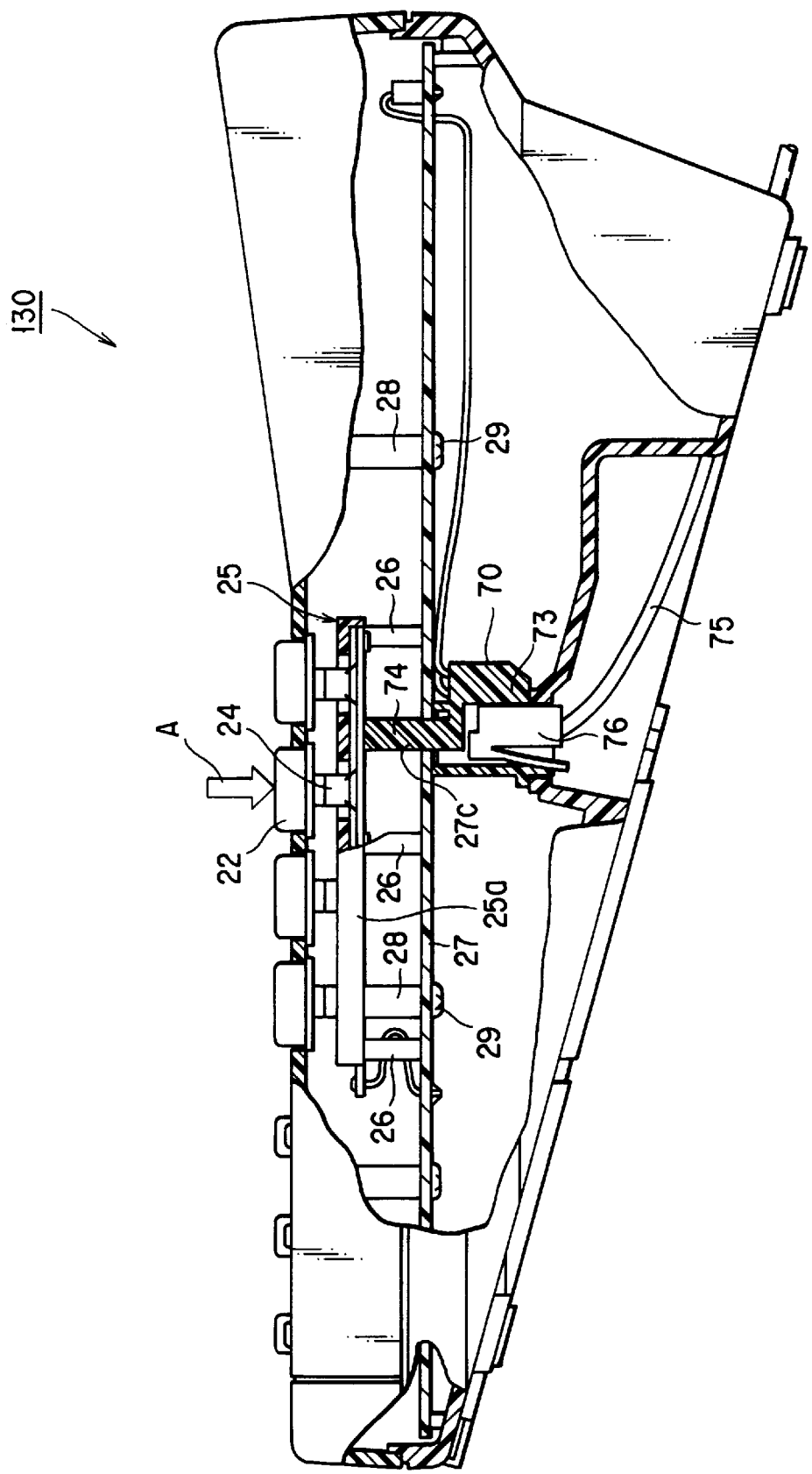
FIG. 13 is a partially cross section and broken side view of a telephone according to a fourth embodiment of the present invention.

As shown in FIG. 13, in a telephone 130 according to a fourth embodiment, a boss 74 projecting from the modular jack 70 extends toward the keypad switch assembly 25 penetrating through a through hole 27c formed in the main circuit board 27 so that its distal end portion abuts against the back side of the keypad frame 25.

Whereby an external force A acting on the keypad switch assembly 25 through the operational button 22 is received by the lower cover 31 via the keypad frame 25a, the boss 74 of the modular jack 70 and a main body 73 of the modular jack 70. Therefore, it is possible to prevent a crack from being caused in the main circuit board 27.

Fifth Embodiment

Next, referring now to FIG. 15 to FIG. 19, a telephone according to a fifth embodiment further improving the aforesaid telephone 103 of the first embodiment will be described below.

In the aforesaid telephone 100 of the first embodiment, as shown in FIG. 3, four long ribs 2d to 2g in total vertically extends downward from the inner face of the upper cover so that the liquid crystal display panel substrate 44 is abutted against their lower end portions. Thus, a predetermined space is defined between the upper cover 2 and the liquid crystal display panel substrate 44.

With the above structure, an influence is not given to the switch 49 provided on the liquid crystal display panel substrate 44 even if a static electricity flows through the surface of the upper cover 2.

However, the aforesaid rubs 2d to 2g are formed so as to vertically extend from the inner face of the upper cover 2; for this reason, not only a mold for injection molding of the upper cover 2 made of resin material becomes complicate in its shape, but also die releasing from the mold for the upper cover 2 becomes worse in injection molding. There is a possibility that a sink mark is caused in the surface of the upper cover 2.

Also, operational buttons 15 and 16 for operating the switches 49 becomes long; for this reason, when a corner portion of the operational buttons 15 and 16 is pushed with a finger, there is a possibility that these operational buttons 15 and 16 sink into the operational button hole formed in the transparent cover 4 and the upper cover 2, and are not returned to the original state.

Taking such circumstances into consideration, the following improvement is made in a telephone 140 according to the fifth embodiment.

Figure 15:
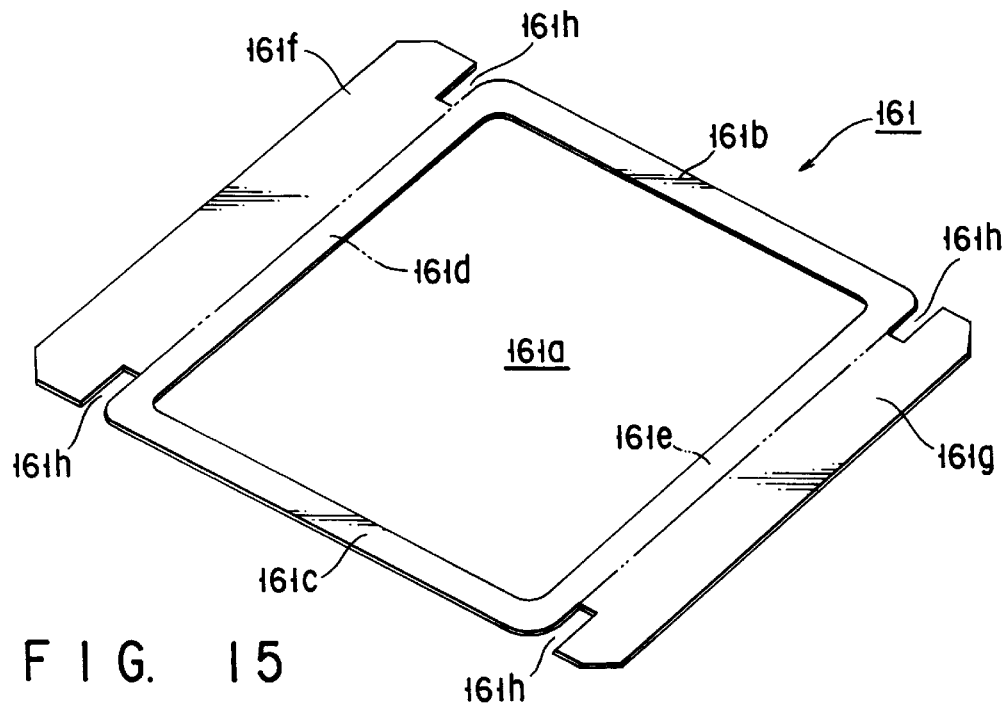
FIG. 15 is an enlarged perspective view showing a telephone sheet according to a fifth embodiment of the present invention.

In this embodiment, first, the synthetic resin sheet 61 is modified to a sheet 161 having a shape as shown in FIG. 15 although it has been interposed between the upper cover 2 and the liquid crystal display panel 41 in the telephone 100 of the first embodiment.

Figure 16:
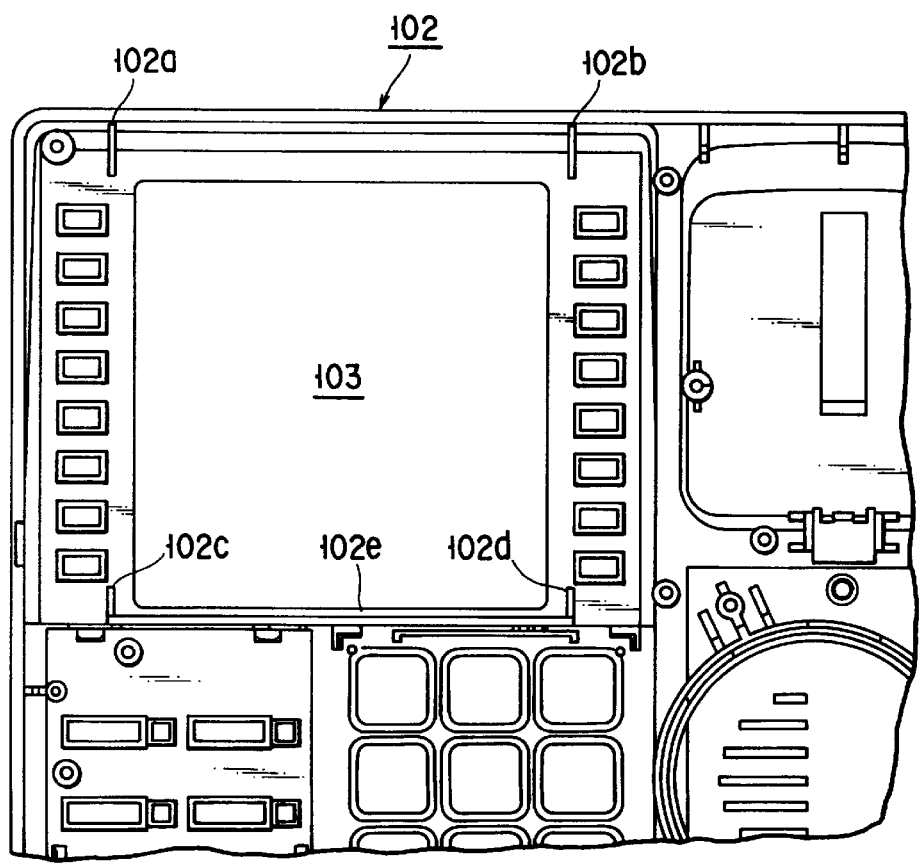
FIG. 16 is a front view showing principal parts of an inner surface of an upper cover of the telephone according to a fifth embodiment of the present invention.

Secondary, long ribs 2d to 2g are modified to positioning ribs 102a to 102e having a short length as shown in FIG. 16 to FIG. 18 although these long ribs 2d to 2g vertically extend from the inner face of the upper cover 2 in the telephone 100 of the first embodiment.

The aforesaid sheet 161 is formed by being punched out of an insulating material having elasticity, for example, a thin sheet-like material made of silicon rubber. The sheet 161 has four side portions 161b to 161e which constitute a square frame as shown by a chain double-dashed line of FIG. 15 forming a central window hole 161a and having the same shape as the sheet 61 of the first embodiment, and elongated portions 161f and 161g which individually extend from two sides 161d and 161e facing each other in the square frame. Also, notch portions 161h for receiving positioning ribs 102a to 102e are formed between the two side portions 161d and 161e and the elongated portions 161f and 161g.

As shown in FIG. 17, the sheet 161 is stack to an inner face 102f of an upper cover 102 so that four side portions 161b to 161e (see FIG. 15) constituting the square frame are situated along the circumstance of a window hole 103 of the upper cover 102, and so that the elongated portions 161f and 161g are interposed between the operational buttons 115 and 116 and a switch 149 on a liquid crystal display panel substrate 144.

In this case, since positioning ribs 102a to 102e are respectively received in notch portions 161h, these positioning ribs 102a to 102e do not hinder sticking the sheet 161 to the inner face 102f of the upper cover 102.

When the liquid crystal display panel 141 is attached to the upper cover 102 in a state of positioned by means of the positioning ribs 102a to 102e, four side portions 161b to 161e constituting the square frame of the sheet 161 are interposed between the liquid crystal display panel 141 and the upper cover 102. Therefore, the sheet 161 can not only prevent the liquid crystal display panel 141 from being damaged when the liquid crystal display panel 141 abuts against the upper cover, but also prevent an entrance of dust from a clearance between the liquid crystal display panel 141 and the upper cover 102. The sheet 161 breaks a static electricity flowing through the surface of the upper cover so that the current does not flow into the liquid crystal display panel 141.

Also, since elongated portions 161f and 161g of the sheet 161 are individually interposed between the operational buttons 115 and 116 and a switch 149 on a liquid crystal display panel substrate 144, so that the static electricity flowing through the surface of the upper cover can be broken by the sheet 161. Therefore, the static electricity does not flow into the liquid crystal display panel substrate 144 through the switch 149. In this case, since these elongated portions 161f and 161g of the sheet 161 are very flexible, no failure is brought about an operation of the switch 149 by the operational buttons 115 and 116.

Namely, in the telephone 140 according to the fifth embodiment, the static electricity flowing through the surface of the upper cover is broken by the sheet 161, so that it does not flow into the liquid crystal display panel substrate 144 through the switch 149. Therefore, the liquid crystal display panel substrate 144 can be arranged in a state of being close to the upper cover 102.

As shown in FIG. 18, a thickness of a spacer 148 for sticking the liquid crystal display panel 141 to the liquid crystal display panel substrate 144 can be considerably made thin as compared with the spacer 48 of the telephone 100 according to the first embodiment.

With the aforesaid construction, it is possible to enlarge a space between the liquid crystal display panel substrate 144 and a main circuit board 127. This serves to facilitate a layout design of components to be mounted on the main circuit board 127. Also, many functional components are further mounted on the main circuit board 127, so that a function of the telephone 140 according to the fifth embodiment can be further improved.

In the telephone 140 according to the fifth embodiment, by taking use of the operation of the sheet 161 (61), positioning ribs 102a to 102e extending from the inner face of the upper cover 102 are used only to position the liquid crystal display panel 141. Therefore, a length of these positioning ribs can be considerably made short as compared with ribs 2d to 2g of the telephone 100 according to the first embodiment.

Whereby not only the shape of die for injection molding of the upper cover 102 is made simple, but also die releasing from the die is improved in injection molding of the upper cover 102. A sink mark can be securely prevented from being caused in the surface of the upper cover 102.

In the telephone 140 according to the fifth embodiment, further, since the sheet 161 interposed between the liquid crystal display panel 141 and the upper cover 102 is elongated so as to be interposed between the operational buttons 115 and 116 and the switch 149, it is possible to form the sheet 161 into an integral structure. Therefore, not only manufacture cost can be reduced, but also a work for sticking the sheet 161 to the upper cover can be readily performed.

Figure 19:
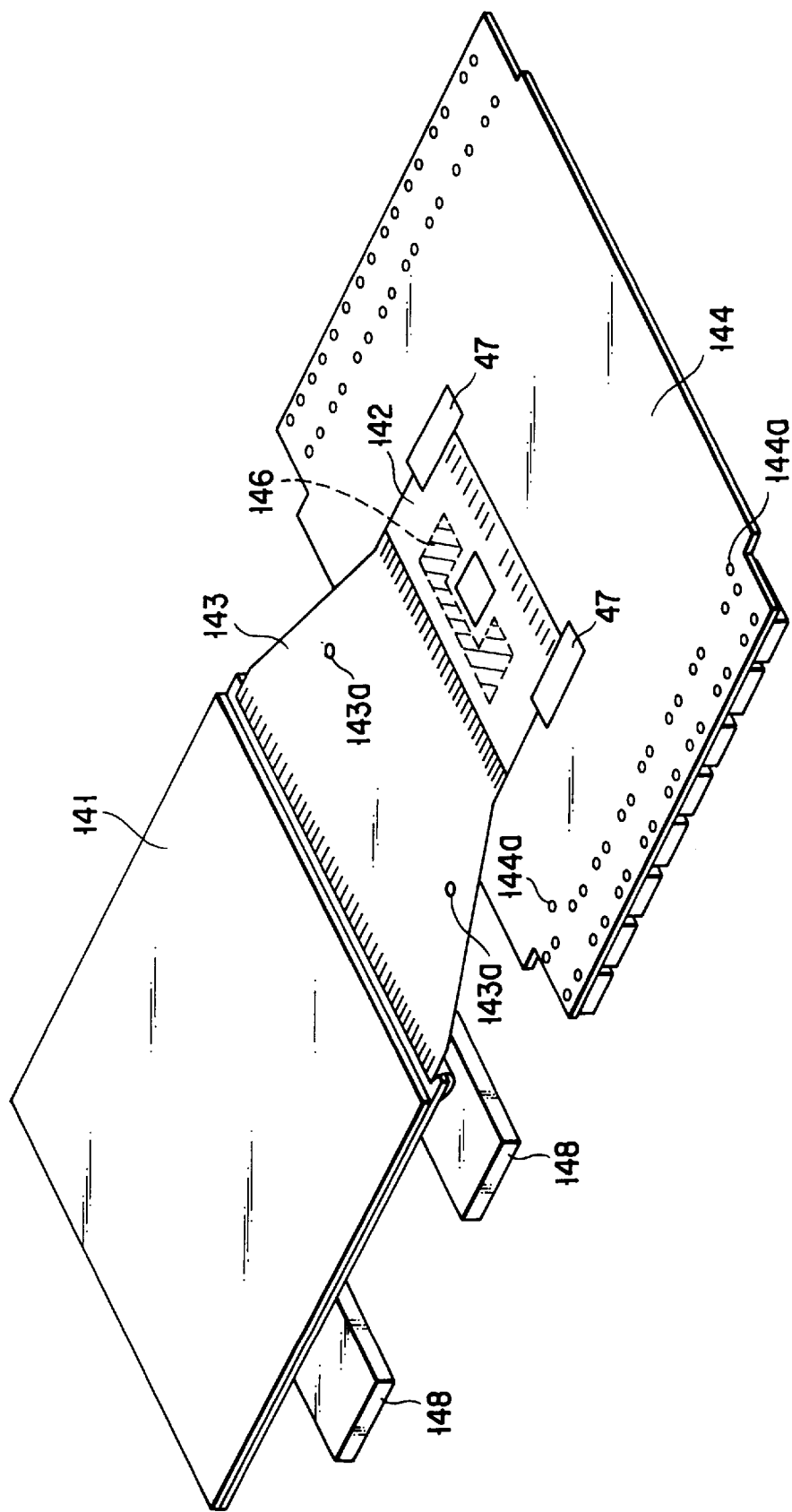
FIG. 19 is a developed perspective view of a liquid crystal display unit of the telephone according to the fifth embodiment of the present invention of FIG. 15.

In the telephone 140 according to the fifth embodiment, furthermore, as shown in FIG. 19, the liquid crystal display panel 141, the tape carrier package 142 and the heat seal 143 are further improved as compared with the same components as shown in FIG. 4 according to the first embodiment.

More specifically, in the telephone 100 according to the first embodiment, as shown in FIG. 6 to FIG. 8, the liquid crystal display panel 41, the tape carrier package 42 and the heat seal 143 are provided with the pair of T-letter marks 41d, the pair of cross marks 42h and the pair of T-letter marks 43i and the pair of cross marks 43j, which are used for positioning, respectively.

On the other hand, the liquid crystal display panel 141, tape carrier package 142 and the heat seal 143 of the fifth embodiment are not provided with the aforesaid T-letter marks or cross marks which are used for positioning. This serves to reduce each form plate for forming the T-letter marks or cross marks by pattern printing; therefore, manufacture cost can be reduced.

Like the first embodiment, positioning is performed with use of dummy terminals provided in each of the liquid crystal display panel 141, the tape carrier package 142 and the heat seal 143, so that yield can be improved without causing a shift in position.

As shown in FIG. 19, the heat seal 143 and the liquid crystal display panel substrate 144 are respectively formed with positioning circular hole 143a and 144a so that they can be readily fixed onto an assembling jig.

A double-faced tape 146 for sticking the tape carrier package 142 to the surface of the liquid crystal display panel substrate 144 is formed into a shape of U-letter as shown by a dotted line in FIG. 19. Therefore, the tape carrier package 142 can be further securely fixed on the surface of the liquid crystal display panel substrate 144.

Sixth Embodiment

Next, a telephone according to a sixth embodiment will be described below with reference to FIG. 20 to FIG. 22. The telephone of this embodiment has further improvement of the telephone 130 according to the fourth embodiment.

The telephone 130 according to the fourth embodiment has the structure in which the distal end of the boss 74 projecting from the modular jack 70 abuts against the back face of the keypad frame 25a so that the external force A acting on the keypad switch assembly from the operational button 22 is received by the lower cover 31 via the modular jack 70.

In such a structure, the modular jack 70 must be used as a dedicated component for the telephone 130 according to the fourth embodiment; therefore, this is a factor of increasing parts cost.

Figure 20:
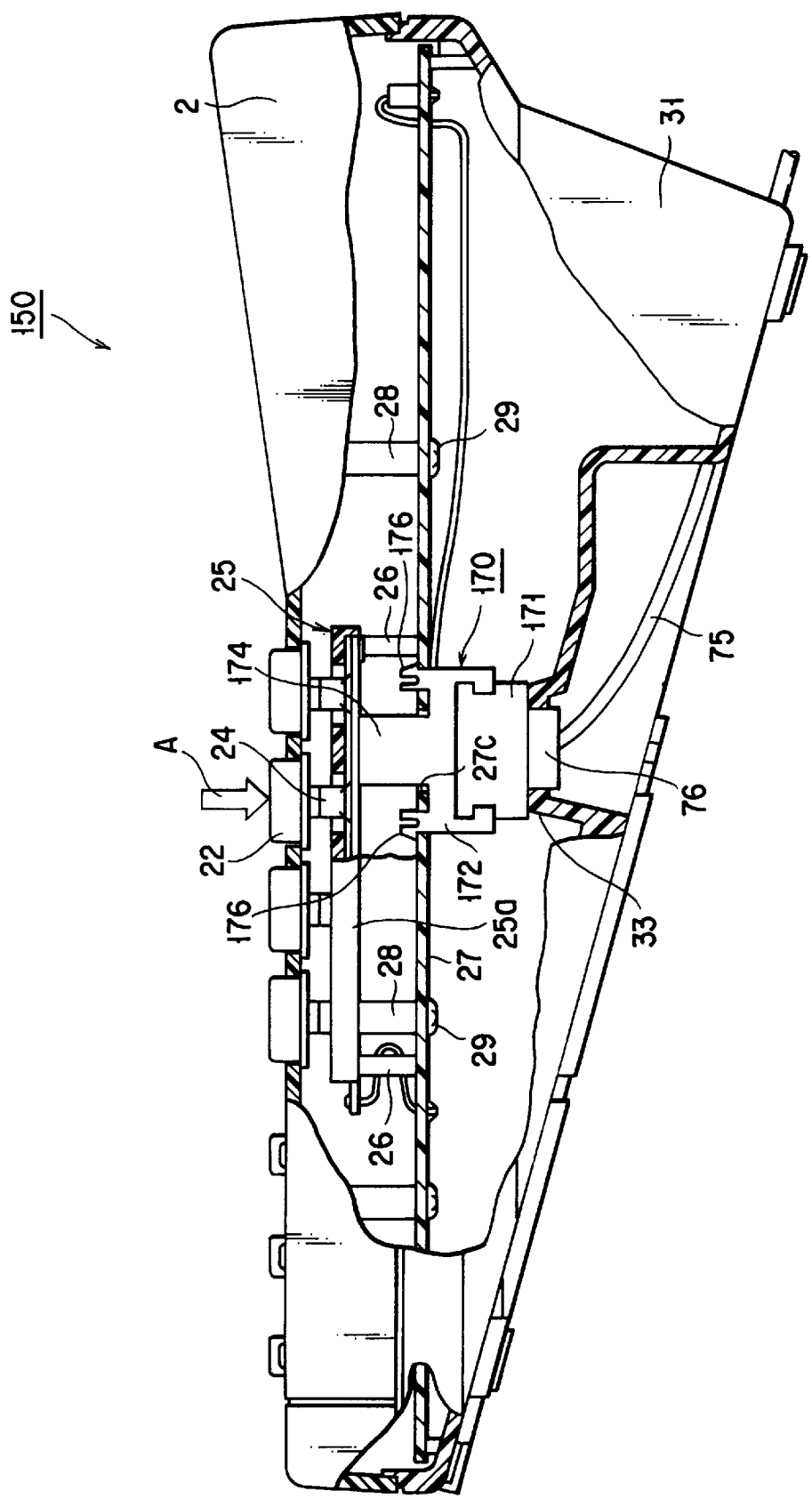
FIG. 20 is a partially cross section and broken side view of a telephone according to a sixth embodiment of the present invention.
Figure 21:
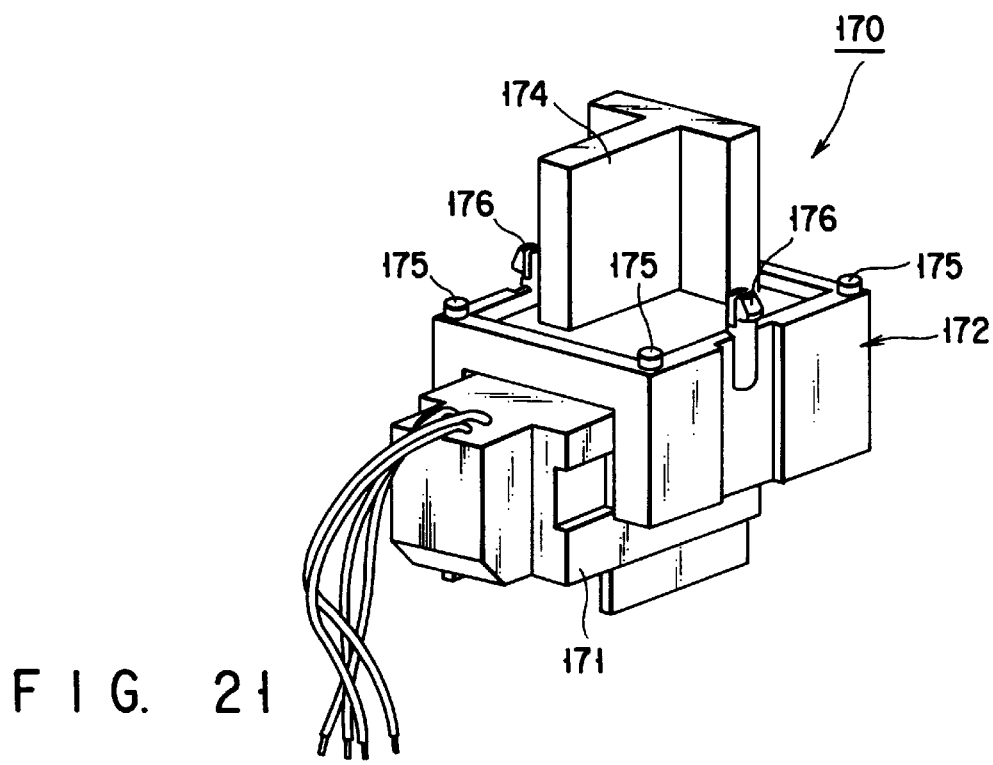
FIG. 21 is a perspective view showing a state of assembling a modular jack of the telephone according to the sixth embodiment of the present invention of FIG. 20.
Figure 22:
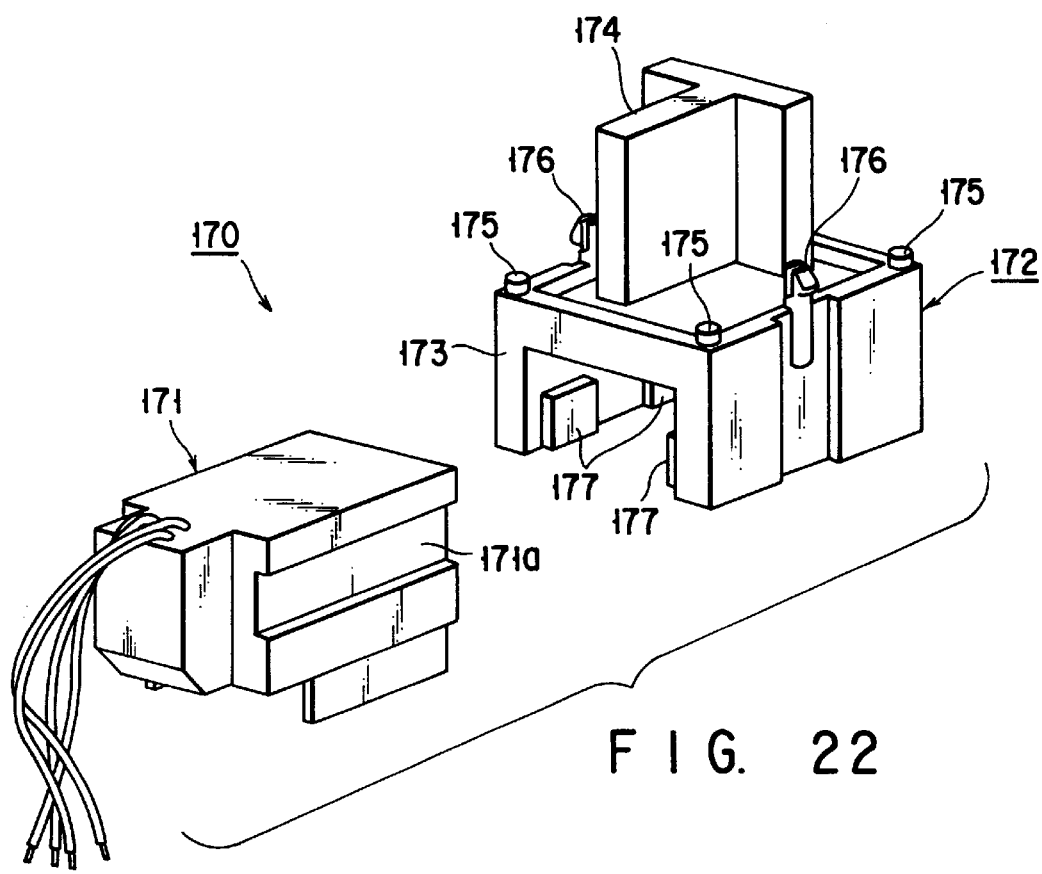
FIG. 22 is an exploded perspective view showing the modular jack of the telephone according to the sixth embodiment of the present invention of FIG. 20.

Taking the above circumstance into consideration, as shown in FIG. 20, in a telephone 150 according to the sixth embodiment, the modular jack for transmitting the external force A acting on the keypad switch assembly 25 to the lower cover 31 is modified to a modular jack assembly 170 having a shape as shown in FIG. 21. The modular jack assembly 170 comprises two parts, that is, a general modular jack 171 on the market, and a holder 172 which is fitted with the modular jack 171.

The aforesaid modular jack 171 is a general part which is world-wide distributed, and can be very cheaply bought from abroad.

On the other hand, the holder 172 is formed out of resin material by injection molding, and is a dedicated part for the telephone 150 according to the sixth embodiment. As shown in FIG. 22, the holder 172 comprises a main body 173 which has a gate-like shape in its section and is fitted with the outside of the modular jack 171, and a boss portion 174 which projects from the upper surface of the main body 173. The main body 173 is formed with a plurality of small bosses 175 which abut against the lower face of the main circuit board 27, and a pair of pawls 176 which engage with the main circuit board 27. Further, the inner face of the main body 173 is formed with a plurality of protrusions 177 which are fitted into a recess portion 171a formed at the outer peripheral surface of the of the modular jack 171 so that the main body 173 is fixed onto the modular jack 171.

Whereby a shape of the holder 72 is made simpler than the aforesaid modular jack 70 according to the fourth embodiment. This serves to simplify a die structure for molding the holder 172; therefore, manufacture cost can be reduced.

When attaching the modular jack assembly 170 to the main circuit board 27, as shown in FIG. 20, the boss 174 of the holder 172 is inserted through the hole 27c formed in the main circuit board 27, and then, the distal end portions of the boss 174 is abutted against the lower face of the keypad switch assembly 25. When the upper cover 102 is attached with the lower cover 31, the lower face of the modular jack 171 is abutted against the modular jack attachment portion 33 of the lower cover 31.

Thus, since the external force A acting on the keypad switch assembly 25 through the operational button 22 is received by the lower cover 31 via the keypad frame 25a, the boss 174 of the modular jack assembly 170, the holder 172 and the modular jack 171, it is possible to prevent a crack from being caused in the main circuit board 27.

Namely, in the telephone 150 according to the sixth embodiment, there is provided the modular jack assembly 170 which transmits the external force A acting on the keypad switch assembly 25 to the lower cover 31. The modular jack assembly 170 comprises two parts, that is, the modular jack 171 which is a general part world-wide distributed and can be very cheaply bought from abroad, and the holder 172 which can be manufactured cheaper than the aforesaid modular jack 70 of the fourth embodiment although being dedicated component. Therefore, the modular jack assembly 170 can be manufactured cheaper than the aforesaid modular jack 70 of the fourth embodiment. This serves to reduce the manufacture cost of the telephone 150 according to the sixth embodiment.

The present invention is not specially limited to the aforesaid embodiments, and various modifications can be made on the basis of the gist of the present invention.

For example, in the aforesaid second to fourth embodiments, the keypad switch assembly 25 is arranged so as to be separated from the main circuit board 27, and is attached to the main circuit board 27 with use of the support column 26. However, the keypad switch assembly 25 may be attached directly to the main circuit board 27.

The aforesaid embodiments show the case of being applied to the telephone. However, the aforesaid embodiments are not specially limited to the telephone, and are applicable to a communication terminal apparatus such as a data communication machine, for example. There can be obtained the same effect as the aforesaid embodiments.

As is evident from the above explanation, in a communication terminal apparatus described in claim 1 of the present invention, the liquid crystal display panel and the tape carrier package are connected to each other with use of the heat seal by thermocompression bonding, and further, the liquid crystal display panel is stack to one side face of the circuit board; on the other hand, tape carrier package is stack to the other side face of the circuit board. Therefore, the structure around the liquid crystal display panel can be greatly simplified. Thus, the liquid crystal display panel can be received in the communication terminal housing by a simple assembling work of only holding the circuit board with use of the retaining member and elastically fitting the retaining member into the hold formed in the circuit board. Accordingly, assembling to the communication terminal housing can be readily realized.

In place of the controller for controlling the liquid crystal display panel, there is used the tape carrier package which has an LSI for controlling the liquid crystal display panel and is connected with lead terminals formed on the surface of the base film. Therefore, the number of components is reduced, so that manufacture cost can be greatly reduced.

Further, in a communication terminal apparatus described in claim 2 of the present invention, the modular jack is arranged so as to face the switch substrate, and has a structure of abutting against the circuit board so as to support the circuit board. Therefore, even if a great external force acts on the circuit board from the switch substrate, the circuit board is not damaged.

There is provided a structure of transmitting the external force acting on the switch substrate to the modular jack via the external force transmission means. Therefore, most of the external force acting on the switch substrate is received by the modular jack and the communication terminal housing, so that the circuit board is not damaged even though the great external force acts on the circuit board from the switch substrate.

With the above construction, it is possible to use a low-price paper phenol base material as a base material for the circuit board although its bending strength is lower than a glass base material. Therefore, part cost can be reduced.

The circuit board is not warped by operating the dial buttons, etc. Therefore, there can be manufactured a telephone having no squeak and a high quality. Also, the center portion of the circuit board is supported by means of the modular jack, so that the number of screws for fixing the circuit board to the boss can be reduced. Therefore, manufacture cost can be reduced. In addition, the modular jack is provided in the center of the lower cover, so that the telephone can be readily used in a state of being hanged on a wall from a state of being used on a desk.

Furthermore, in a communication terminal apparatus described in the present invention, an elastic sheet made of an insulating material is interposed between the operational button and the switch, so that a static electricity can be broken between the operational button and the switch. Therefore, the circuit board inclusive of the liquid crystal display panel can be arranged in a state of being close to the communication terminal housing.

With the above construction, it is possible to effectively make use of a space defined in the communication terminal housing. This serves not only to facilitate a layout design of components mounted on the circuit board, but also to further mount many functional components on the circuit board. Therefore, the function of the communication terminal apparatus can be further improved.

The aforesaid sheet performs a function of fixing the liquid crystal display panel in a state of being separated with only predetermined distance with respect to the communication terminal housing. Thus, the long rib projecting from the inner face of the communication terminal housing can be modified to a short rib for only positioning the liquid crystal display panel. Therefore, this serves not only to make simple a shape of die for injection molding of the communication terminal housing, but also to improve die releasing from the die for communication terminal housing in injection molding. In addition, a "sink mark" can be securely prevented from being caused in the surface of the communication terminal housing.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A communication terminal apparatus comprising:

a communication terminal housing;

a main circuit board provided in the communication terminal housing;

a liquid crystal display panel provided in the communication terminal housing and having at least one signal terminal on one side edge thereof;

a tape carrier package having a semiconductor element which is used for controlling the liquid crystal display panel and which is provided about a surface of a base film, said tape carrier package having signal terminals on two sides that are opposed to each other;

a heat seal having at least one lead terminal which is used for connecting said at least one signal terminal of the liquid crystal display panel to the signal terminal on one of said two sides of the tape carrier package and which is formed about one surface of the base film, said lead terminal being connected to the signal terminals of the liquid crystal display panel and the tape carrier package by thermocompression bonding;

a liquid crystal display panel substrate having one surface about which the liquid crystal display panel is provided and another surface about which the tape carrier package is provided, the signal terminal on another one of the two sides of the tape carrier package being connected to a terminal provided about said another surface of the liquid crystal display panel substrate by thermocompression bonding; and retaining means for positioning the liquid crystal display panel substrate with reference to the main circuit board so as to allow the liquid crystal display panel to be located at a predetermined position in the communication terminal housing.

2. A communication terminal apparatus according to claim 1, wherein said retaining means includes a retaining member which has a clamping portion for clamping the liquid crystal display substrate and an engagement portion being engageable with the main circuit board, and said liquid crystal display panel being positioned and held at the predetermined position in the communication terminal housing by bringing the engagement portion into engagement with the main circuit board.

3. A communication terminal apparatus according to claim 1, wherein said liquid crystal display panel substrate is provided with a switch located on at least one side of the liquid crystal display panel.

4. A communication terminal apparatus according to claim 2, wherein said liquid crystal display panel substrate is provided with a switch located on at least one side of the liquid crystal display panel.

5. A communication terminal apparatus according to claim 1, further comprising an elastic spacer interposed between the liquid crystal display panel and the liquid crystal display panel substrate.

* * * * *

UNITED STATES PATENT AND TRADEMARK OFFICE
CERTIFICATE OF CORRECTION

PATENT NO.   : 6,038,311
DATED        : March 14, 2000
INVENTORS    : Kenji NITOBE et al.

It is certified that error appears in the above-identified patent and that said Letters Patent is hereby corrected as shown below:

Title Page, Item [57], in the Abstract, line 2, after "panel," insert --and the liquid crystal display panel--.

Signed and Sealed this

Twentieth Day of March, 2001

Attest:

NICHOLAS P. GODICI

Attesting Officer             Acting Director of the United States Patent and Trademark Office